(12) United States Patent
Jiang et al.

(10) Patent No.: US 10,461,268 B2
(45) Date of Patent: Oct. 29, 2019

(54) FLEXIBLE DISPLAY PANEL AND DISPLAY DEVICE

(71) Applicant: SHANGHAI TIANMA MICRO-ELECTRONICS CO., LTD., Shanghai (CN)

(72) Inventors: Wenxin Jiang, Shanghai (CN); Yong Wu, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 0 days.

(21) Appl. No.: 16/105,981

(22) Filed: Aug. 21, 2018

(65) Prior Publication Data

US 2019/0019966 A1 Jan. 17, 2019

(30) Foreign Application Priority Data

Mar. 28, 2018 (CN) .......................... 2018 1 0262711

(51) Int. Cl.
*H01L 23/02* (2006.01)
*H01L 51/00* (2006.01)
*H01L 51/52* (2006.01)
*H01L 27/32* (2006.01)

(52) U.S. Cl.
CPC ...... *H01L 51/0097* (2013.01); *H01L 27/3276* (2013.01); *H01L 51/5253* (2013.01); *H01L 2251/5338* (2013.01)

(58) Field of Classification Search
CPC ......... H01L 2251/5338; H01L 51/0097; H01L 27/3244; H01L 27/3276; H01L 2251/301; H01L 27/3293; H01L 27/3241; H01L 27/3267
USPC .................. 257/59, 40, 678, 79, 81, 432
See application file for complete search history.

(56) References Cited

U.S. PATENT DOCUMENTS

| 10,211,416 | B2* | 2/2019 | Jin ...................... H01L 51/0097 |
| 2015/0357387 | A1* | 12/2015 | Lee ..................... H01L 51/0097 257/40 |
| 2018/0067522 | A1* | 3/2018 | Namkung ......... G02F 1/133305 |
| 2019/0129541 | A1* | 5/2019 | Kwon ................. H01L 51/5256 |
| 2019/0140202 | A1* | 5/2019 | Jin ...................... H01L 27/3276 |

* cited by examiner

*Primary Examiner* — S. V. Clark
(74) *Attorney, Agent, or Firm* — Kilpatrick Townsend & Stockton, LLP

(57) ABSTRACT

The present disclosure provides a flexible display panel and a display device. The flexible display panel includes a substrate, an inorganic layer disposed on a side of the substrate, and an organic layer disposed on a side of the inorganic layer away from the substrate. The inorganic layer includes a non-recessed region and a recessed region having a recess with an opening facing away from the substrate. The organic layer includes a filling portion. A projection of the filling portion in a direction perpendicular to the substrate is located in the recess. In at least one first cross-section of the flexible display panel perpendicular to the substrate, a surface of the filling portion away from the substrate is a concave surface. The concave surface is recessed toward the substrate. The display device includes the above flexible display panel.

19 Claims, 14 Drawing Sheets

FLEXIBLE DISPLAY PANEL AND DISPLAY DEVICE

CROSS-REFERENCE TO RELATED APPLICATIONS

The present application claims priority to Chinese Patent Application No. 201810262711.4, filed on Mar. 28, 2018, the content of which is incorporated herein by reference in its entirety.

TECHNICAL FIELD

The present disclosure relates to display technology, and more particularly, to a flexible display panel and a display device.

BACKGROUND

Flexible display panel is a deformable and bendable display device. Currently, it is a focus of research and development in the display technology due to its advantages of portability, foldability, bendability and the like.

A film layer of the flexible display device positioned on a convex side of a neutral plane is subjected to tensile stress when being folded to a folded state from a flat state. If the stress is too large, the film layer may be detached and problems of cracking, line disconnection and the like may occur, thereby affecting normal display of the flexible display panel and reducing the service life of the flexible display panel.

SUMMARY

In view of this, the present disclosure provides a flexible display panel and a display device.

The flexible display panel provided by the present disclosure includes a substrate, an inorganic layer disposed on a side of the substrate, and an organic layer disposed on a side of the inorganic layer away from the substrate. The inorganic layer includes a recessed region and a non-recessed region, and the recessed region includes a recess with an opening facing away from the substrate. The organic layer includes a filling portion, and a projection of the filling portion in a direction perpendicular to the substrate is located in the recess of the recessed region. A surface of the filling portion away from the substrate is a concave surface, and the concave surface is recessed toward the substrate.

The present disclosure also provides a display device including the flexible display panel described above.

REFERENCE SIGNS

Figure 1:
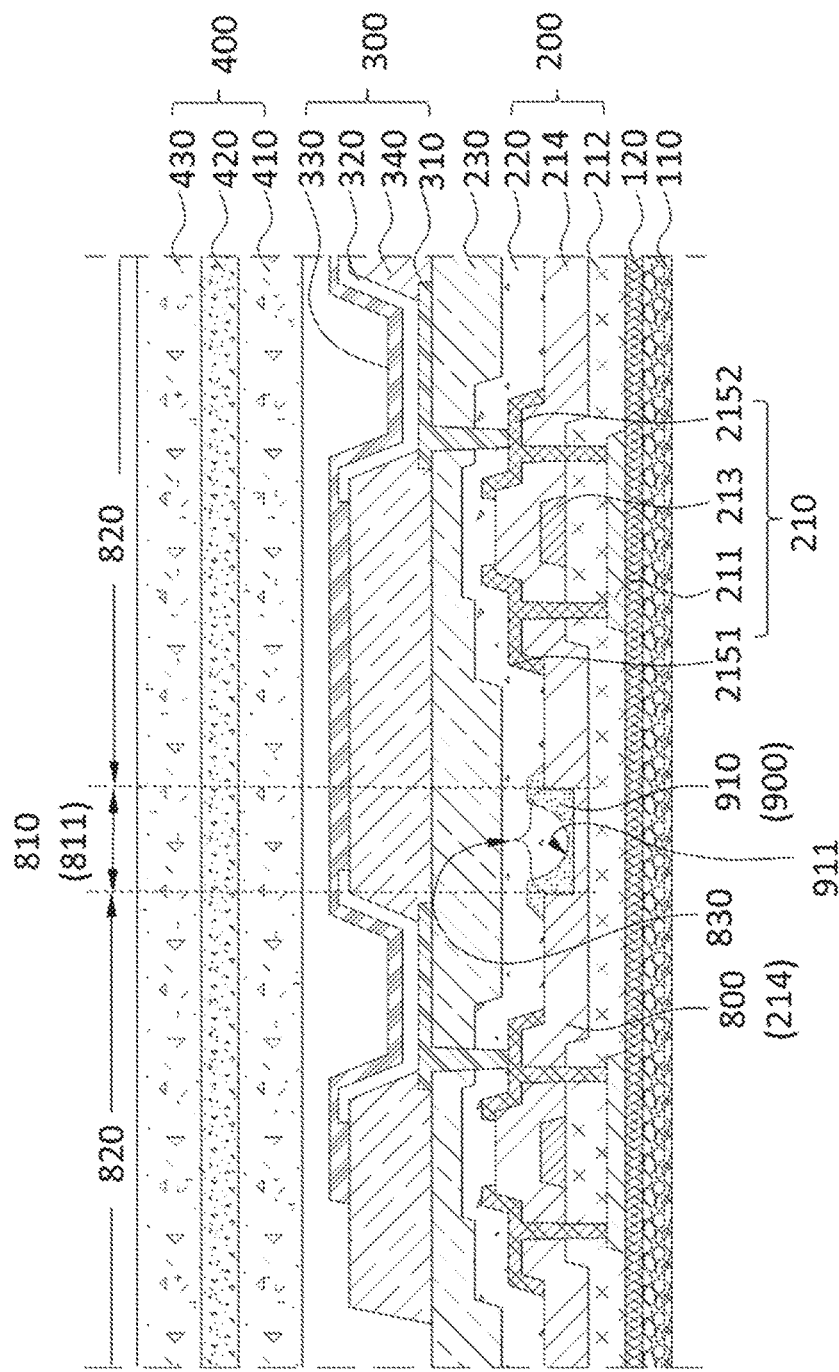
FIG. 1 is a schematic structural cross-sectional view of a flexible display panel according to an embodiment of the present disclosure.

AA—display area;
NA—non-display area;
BB—bending region;
UB—non-bending region;
K—bending axis;
X—first direction;
Y—second direction;
D1—first interval;
D2—second interval;
C1—first region;
C2—second region;
110—substrate;
120—buffering layer;
200—array layer;
300—display function layer;
400—encapsulation layer;
210—thin film transistor;
211—active layer;
212—gate insulation layer;
213—gate electrode;
214—interlayer insulation layer;
2151—source electrode;
2152—drain electrode;
220—passivation layer;
230—planarization layer;
310—anode layer;
320—organic light-emitting material;
330—cathode layer;
340—pixel definition layer;
410—first inorganic encapsulation layer;
420—first organic encapsulation layer;
430—second inorganic encapsulation layer;
500—bank;
510—first dam;
520—second dam;
503—third bank layer;
600—touch function layer;
610—touch electrode;
620—touch wiring;
630—touch insulation layer;
611—first touch electrode;
612—second touch electrode;
700—wiring;
800—inorganic layer;
810—recessed region;

811—recess;
820—non-recessed region;
830—opening;
900—organic layer;
910—filling portion;
901—first filling portion;
902—second filling portion;
920—climbing portion;
911—concave surface.

DESCRIPTION OF EMBODIMENTS

In order to better understand purposes, features and advantages of the present disclosure, embodiments of the present disclosure are described in details with reference to the drawings.

It should be clear that details in the following description are merely used to assist in a full understanding of the present disclosure. However, the present disclosure can be implemented in a variety of manners different from those described herein. Therefore, the present disclosure is not limited to the embodiments disclosed below.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

It should be noted that, the expressions such as "upper", "lower", "left", "right" and the like mentioned in embodiments of the present disclosure are described with reference to the placement orientations shown in the accompanying drawings, and should not be construed as limits to the embodiments of the present disclosure. In addition, it should also be understood that, in the context, when referring to one element being formed "above" or "below" another element, it is possible that the one element is directly formed "above" or "below" the another element, and it is also possible that the element is formed "above" or "below" the other element via an intermediate element.

The embodiments are provided to make the present disclosure more comprehensive and complete. Same reference signs in the drawings denote same or similar structures, and thus the repeated description thereof is omitted. The expressions related to positions or orientations in the description of the present disclosure are described with reference to the accompanying drawings. These expressions may change as needed, and any change should be included in the protection scope of the present disclosure. The drawings of the present disclosure are merely used for illustrating the relative position, and the thickness of layer in some portions is illustrated in an enlarged manner. Therefore, the thicknesses of layers in the drawings do not represent proportional relationships of actual thicknesses of these layers. The embodiments in the present disclosure and the features in the embodiments can be combined with one another.

In the following embodiments, the flexible display panel is illustrated as a rectangle. In practical applications, the flexible display panel may be in a regular shape, such as circle or polygon, or in an irregular shape, which is not specifically limited in the present disclosure. Meanwhile, the size of each structure is correspondingly adjusted in the drawings described below, in order to more clearly illustrate structure of each part in the flexible display.

It should be also noted that the ellipses " . . . " in the following drawings means that the flexible display panel extends in the left-right direction or the up-down direction, and the omitted portion may include other structures that are no specifically limited in the present disclosure. The same or similar structures are denoted with same reference signs in the following drawings of the embodiments of the present disclosure. In addition, same features of different embodiments may be only described once.

FIG. 1 is a schematic structural cross-sectional view of a flexible display panel according to an embodiment of the present disclosure.

As shown in FIG. 1, the flexible display panel includes a substrate 110, an array layer 200 disposed on the substrate 110, a display function layer 300 disposed on the array layer 200, and an encapsulation layer 400 disposed on the display function layer 300. Some of the "on"s mentioned in this embodiment can be understood as "on a side away from the substrate".

The substrate 110 (i.e., a base substrate) is flexible, i.e., the substrate is stretchable, foldable, bendable, or rollable, such that the flexible display panel is stretchable, foldable, bendable, or rollable. The substrate 110 can be made of any suitable insulation material having flexibility. The substrate 110 is used to block oxygen and moisture, prevent moisture or impurities from being diffused through the flexible substrate, and provides a flat upper surface of the flexible substrate. For example, the substrate 110 can be made of a polymer material, for example, polyimide (PI), polycarbonate (PC), polyether sulfone (PES), polyethylene glycol terephthalate (PET), polyethylene naphthalate (PEN), polyarylate (PAR), glass fiber reinforced plastic (FRP), or the like. The substrate 110 can be transparent, translucent, or opaque.

In an embodiment, the flexible display panel may further include a buffering layer 120 disposed on the substrate 110. The buffering layer 120 can cover the entire upper surface of the substrate 110. For example, the buffering layer 120 can be made of an inorganic material selected from a group consisting of silicon oxide (SiOx), silicon nitride (SiNx), silicon oxynitride (SiOxNy), aluminum oxide (AlOx), or aluminum nitride (AlNx). In other embodiments of the present disclosure, the buffering layer can be made of an organic material selected from a group consisting of acrylic, polyimide (PI), polyester, or the like. The buffering layer 120 can include a single layer or multiple layers. The buffering layer 120 can prevent impurities in the base substrate from diffusing into other layers.

The array layer 200 can include a plurality of thin film transistors (TFTs) 210. The thin film transistors constitute a pixel circuit for controlling a light-emitting structure in a display function layer. The light-emitting structure can be an organic light-emitting diode.

In the embodiments of the present disclosure, a top gate thin film transistor is taken as an example to explain the structure of the thin film transistor. The thin film transistor 210 includes an active layer 211 disposed on the substrate 110, a gate insulation layer 212 disposed on the active layer 211, a gate electrode 213 disposed on the gate insulation layer 212, an interlayer insulation layer 214 disposed on the gate electrode 213, and a source electrode 2151 and a drain source 2152 disposed on the interlayer insulation layer 214.

The active layer 211 can be made of an amorphous silicon material, a polysilicon material, a metal oxide material, or the like. When adopting the polysilicon material, the active layer 211 can be formed by using a low-temperature amorphous silicon technology, that is, the amorphous silicon material is melted by laser to form the polysilicon material. In addition, other methods also can be adopted, such as rapid thermal annealing (RTA), solid phase crystallization (SPC), excimer laser annealing (ELA), metal induced crystallization (MIC), metal induced lateral crystallization (MILC), successive lateral solidifying (SLS) or the like. The active layer 211 includes a source region and a drain region formed by doping N-type impurity ions or P-type impurity ions, and a channel region between the source region and the drain region.

The gate insulation layer 212 may include a single inorganic layer or multiple inorganic layers of silicon oxide, silicon nitride, or the like.

The gate electrode 213 can include a single layer or multiple layers of gold (Au), silver (Ag), copper (Cu), nickel (Ni), platinum (Pt), palladium (Pd), aluminum (Al), molybdenum (MO) or chromium (Cr). The gate electrode 213 may include a layer of alloy, such as aluminum (Al): neodymium (Nd) alloy or molybdenum (MO): tungsten (W) alloy.

The interlayer insulation layer 214 may be formed by an inorganic insulation material such as silicon oxide or silicon nitride. In some other embodiments of the present disclosure, the interlayer insulation layer may be formed by an organic insulation material.

The source electrode 2151 and the drain electrode 2152 are electrically connected (or coupled) to the source region and the drain region through contact holes, respectively. The contact holes are formed by selectively removing some parts of the gate insulation layer 212 and of the interlayer insulation layer 214.

The array layer 200 may further include a passivation layer 220. In an embodiment, the passivation layer 220 is located on source electrodes 2151 and drain electrodes 2152 of the thin film transistors 210. The passivation layer 220 can be formed by an inorganic material such as silicon oxide, silicon nitride or the like, or by an organic material.

The flexible display panel may further include a planarization layer 230. In an embodiment, the planarization layer 230 is arranged on the passivation layer 220. The planarization layer 230 includes an organic material, such as acrylic, polyimide (PI), benzocyclobutene (BCB) or the like. The planarization layer has a planarization effect.

The display function layer 300 is located on a side of the array layer 200 away from the substrate 110. In an embodiment, the display function layer 300 is located on the planarization layer 230. The display function layer 300 includes an anode layer 310, an organic light-emitting material 320, and a cathode layer 330 that are sequentially disposed in a direction away from the substrate 110. The display function layer 300 further includes a pixel definition layer 340 on a side of the anode layer 310 away from the array layer 200. The pixel definition layer 340 can be formed by an organic material, such as polyimide (PI), polyamide, benzocyclobutene (BCB), acrylic resin, phenolic resin or the like. The pixel definition layer 340 can also be formed by an inorganic material, such as SiNx.

In an embodiment, the anode layer 310 includes a plurality of anode patterns corresponding to pixel units in one-to-one correspondence. Each anode pattern in the anode layer 310 is connected to the source electrode 2151 or the drain electrode 2152 of the thin film transistor 210 through a though-hole in the planarization layer 230. The pixel definition layer 340 includes a plurality of openings for exposing the anode layer 310, and the pixel definition layer 340 covers edges of the anode patterns of the anode layer 310. The organic light-emitting material 320 is at least partially filled in the openings of the pixel definition layer 340 and is in contact with the anode layer 310. In an embodiment, the organic light-emitting material 320 in each opening of the pixel definition layer 340 forms a smallest light-emitting unit. Each light-emitting unit can emit light of different colors according to different materials of the organic light-emitting layer 320. Each light-emitting unit communicates with the pixel circuit to form a pixel. Multiple pixels cooperate to display an image. In an embodiment, the organic light-emitting material 320 can be formed in the openings of the pixel definition layer 340 by using ink jet printing, nozzle printing, or vapor deposition, etc. The cathode layer 330 can be formed on the layer of the organic light-emitting material 320 by vapor deposition. In an embodiment, the cathode layer 330 covers the organic light-emitting material 320 and the pixel definition layer 340 as a continuous layer.

The encapsulation layer 400 (i.e., a thin film encapsulation layer) is located on a side of the display function layer 300 away from the array layer 200, and completely covers the display function layer 300 for sealing the display function layer 300. In one embodiment, the encapsulation layer 400 is located on the cathode layer 330 and includes a first inorganic encapsulation layer 410, a first organic encapsulation layer 420, and a second inorganic encapsulation layer 430 that are disposed sequentially in a direction away from the substrate 110. In other embodiments of the present disclosure, the encapsulation layer can include any number of stacked organic material layers and inorganic material layers as required, as long as the encapsulation layer include at least one organic material layer and at least one inorganic material layer that are alternately deposited, and the lowermost layer and the uppermost layer is made of the inorganic material.

The flexible display panel may further include an inorganic layer 800 on a side of the substrate. In an embodiment, the inorganic layer 800 is located in the array layer 200. In an embodiment, the inorganic layer 800 can be the buffering layer 120, the gate insulation layer 212, the interlayer insulation layer 214, the passivation layer 220, or any combination thereof. In other embodiments of the present disclosure, the inorganic layer can be located on other film layers in the flexible display panel, or be an additionally formed layer; or other existing layer formed by an inorganic material in the flexible display panel is further used as the inorganic layer 800.

For example, the interlayer insulation layer 214 is used as the inorganic layer 800.

The inorganic layer 800 includes recessed regions 810 and non-recessed regions 820. The recessed region 810 includes a recess 811 having an opening 830 facing away from the substrate. In an embodiment, the recess 811 does not penetrate the interlayer insulation layer 214. In an embodiment, the display panel further includes a plurality of scan lines (not shown) or other wirings for signal transmission. The scan lines or other wirings for transmitting non-scanning signal are formed with a same material and in a same layer as the gate electrode, so as to avoid additional layers, thereby avoiding an increase in the thickness of the display panel and saving material costs at the same time. Similarly, the display panel further includes a plurality of data lines, and the data lines or other wirings for transmitting non-data signal are formed with a same material and in a same layer as the source electrode or the drain electrode. The gate electrode is separated from the layer with the source and drain electrodes by the interlayer insulation layer, and the recesses do not penetrate the interlayer insulation layer. In this way, a contact between the wirings in the same layer as the gate electrode and the wirings in the same layer as the source and drain electrodes, which need to be insulated and intersect with one another, is avoided, thereby avoiding the display deficiency.

In an embodiment, the flexible display panel further includes an organic layer 900 located on a side of the inorganic layer 800 away from the substrate 110. In an embodiment, the organic layer 900 is the passivation layer 220. In an embodiment, the inorganic layer 800 is in direct contact with the organic layer 900. Since the organic material of the organic layer 900 has a lower hardness than the inorganic material of the inorganic layer 800, stress concentration occurs to the inorganic material more likely than to the organic material when the flexible display panel is being bent. Therefore, the stress concentration of the inorganic material can be alleviated by contacting the organic layer with the inorganic layer. In other words, the organic material has a greater elasticity and thus is deformed more easily than the inorganic material, so that the organic layer can buffer and protect the inorganic layer. It can be understood that, though the source and drain electrode layer is located between the interlayer insulation layer and the passivation layer, a part of a conductive film layer (i.e., a part of film layer material for forming the source electrodes and the drain electrodes) is selectively remained at positions requiring design and the rest part of the conductive film layer in other areas is removed during forming the source electrodes and the drain electrodes on the interlayer insulation layer. In the area where the conductive film layer is removed, the interlayer insulation layer may be in direct contact with the passivation layer. In other embodiments of the present disclosure, the organic layer 900 can be an additionally formed film layer, or existing layer formed by an organic material in the flexible display panel is further used as the organic layer.

In an embodiment, the organic layer 900 includes a filling portion 910. A projection of the filling portion 910 in a direction perpendicular to the substrate 110 (i.e., an orthographic projection on the substrate 110) is located in the recess 811 of the recessed region 810.

In at least one first cross-section (e.g., the cross-section of the flexible display panel shown in FIG. 1, the first cross-section is perpendicular to the plane of the substrate 110), the non-recessed region 820 in the inorganic layer 800 is located on both sides of the recessed region 810; a surface of the filling portion 910 of the organic layer 900 away from the substrate 110 (or upper surface) is a concave surface 911, and the concave surface 911 is recessed toward the substrate 110. That is, the upper surface (i.e., the concave surface 911) of the filling portion 910 is a continuous surface recessed toward the substrate 110. In an embodiment, the concave surface 911 and the patterns of the organic layer 800 can be formed in a same process, for example, using a halftone mask. In other embodiments of the present disclosure, the concave surface can be formed in a separate etching process.

It should be noted that, in the present embodiment, the upper surface of the filling portion 910 has a lowest region, i.e., the lowest region of the concave surface 911. In the direction perpendicular to the substrate 110, the height of the upper surface in the lowest region is the smallest. The upper surface has a lowest region, and the height of the upper surface increases in a direction from the lowest region of the upper surface towards the edge of the filling portion 910, instead of decreasing. When comparing the height of the upper surface, the height of the upper surface can be referred to as a distance between the upper surface and the substrate 110 in the direction perpendicular to the substrate 110, or can be uniformly referred to as a distance between the upper surface and the lower surface of the filling portion 910 in the direction perpendicular to the substrate 110, or can be uniformly referred to as the thickness of the filling portion 910 in the direction perpendicular to the substrate 110. That is, one concave surface only has one lowest region, which will be described in detail later in the present disclosure.

Since the recess is provided in the inorganic layer, the recess is filled with the organic material, and an upper surface of the portion of the organic material filled in the recess has a depression, then the organic layer in the recess has a predetermined curved surface (i.e., the aforementioned concave surface) when it is not bent. When the flexible display panel is bent, the predetermined curved surface can exert an effect of buffering.

For example, the flexible display panel is bent around a bending axis such that each point on the bent portion the flexible display panel has a basically same distance to the bending axis. The flexible display panel includes two opposite side surfaces. After the flexible display panel is bent, a concave side surface is a side surface closer to the bending axis and a convex side surface is a side surface away from the bending axis. At this time, the convex direction of the entire organic layer (i.e., the convex side surface of the organic layer after being bent) is a side surface of the organic layer away from the substrate, and the convex direction of the concave surface of the filling portion of the organic layer (i.e., the side surface of the organic layer facing the substrate) is exactly opposite to the convex direction of the entire organic layer after being bent, so that the convex direction of the concave surface of the filling portion can partially offset the convex direction of the entire organic layer and prevent the organic layer from being excessively bent.

In other words, the film layer is relatively elongated after being bent. Since the upper surface of the filling portion is formed as a concave surface in advance, it means that the upper surface of the filling portion is elongated beforehand, without any risk. When the flexible display panel is bent as described above, the upper surface of the filling portion becomes the convex side surface of the organic layer after being bent, and the previously designed concave surface can be used to compensate stretching of the film layer after being bent.

Similarly, when the bending axis is located on a side near the encapsulation layer a depression direction of the upper surface of the filling portion of the organic layer is consistent with the concave direction of the concave surface of the entire organic layer, and the depression formed by concave surface of the filling portion provides the flexible display panel with a bending path, thereby avoiding the stress concentration on the concave surface of the organic layer due to squeezing, and increasing the bending resistance.

If the filling portion of the organic material was designed with a convex surface, the thickness of the film layer would be increased, and accordingly, a thickness of other film layer would be needed to be increased to cover the convex of the organic layer. However, since the filling portion of the organic material is designed with a concave surface in the embodiments of the present disclosure, it can avoid increasing the thickness of the film layer while ensuring improvement of the bending reliability, and it is also unnecessary to increase the thickness of other layer. Moreover, the design of the organic layer in combination with the inorganic recess can alleviate the stress concentration in the inorganic layer, and further improve the bending reliability of the flexible display panel.

Figure 2:
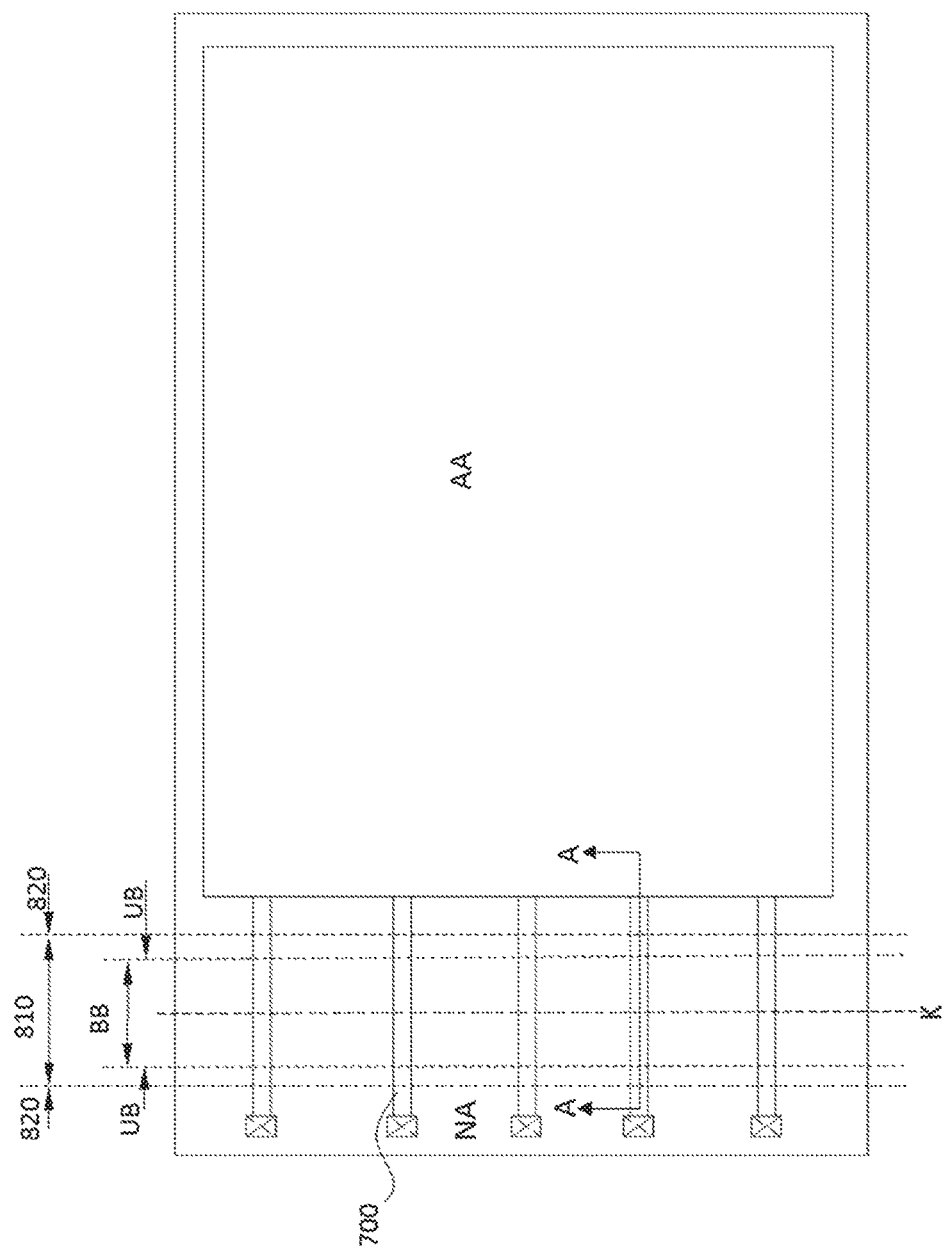
FIG. 2 is a schematic top view of another flexible display panel according to an embodiment of the present disclosure.
Figure 3:
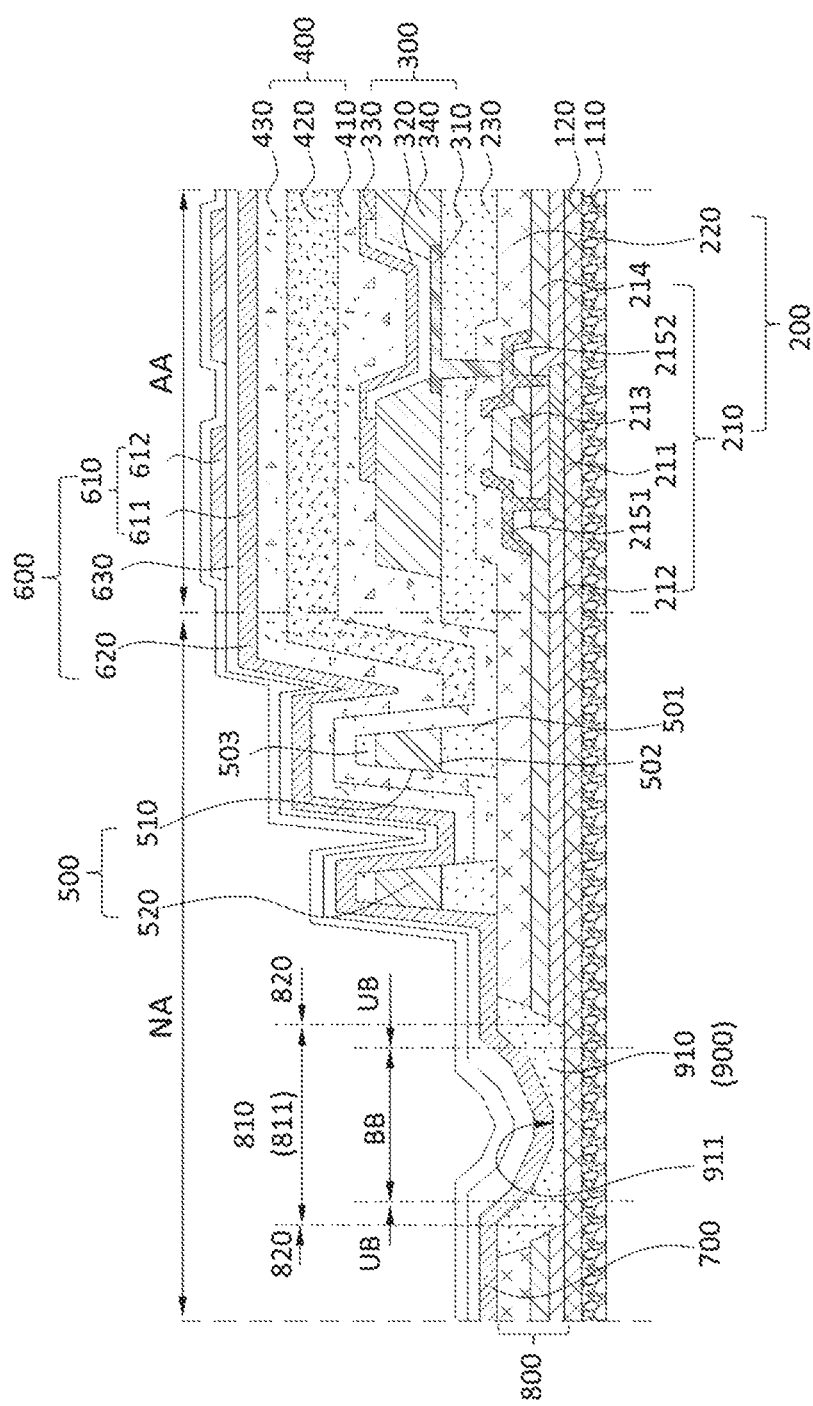
FIG. 3 is a schematic cross-sectional view of the flexible display panel of FIG. 2 along A-A direction.

FIG. 2 is a schematic top view of another flexible display panel according to an embodiment of the present disclosure, and FIG. 3 is a schematic cross-sectional view of the flexible display panel shown in FIG. 2 along A-A direction. It should be noted that the cross-section of the flexible display panel along the A-A direction is hereinafter also referred to as a first cross-section.

In this embodiment, the flexible display panel is divided into a display area AA and a non-display area NA surrounding the display area AA. It can be understood that the display area AA is an area of the display panel used for displaying an image. Generally, the display area AA includes a plurality of pixel units arranged in an array. Each pixel unit includes a respective light-emitting element (for example, organic light-emitting diode) and a respective control element (for example, a thin film transistor that constitutes a pixel driving circuit). The non-display area NA surrounds the display area AA, and generally includes peripheral a driving element, peripheral wirings, and a fan-out area.

In an embodiment, the flexible display panel includes a bending region BB and a non-bending region UB. In an embodiment, the non-display area NA includes the bending region BB and the non-bending region UB. In an embodiment, the first cross-section intersects an extension direction of a bending axis K of the bending region BB. By providing the bending region in the non-display area, the non-display area of the flexible display panel can be folded to a back side of the display panel, and it is beneficial to realize a narrow border of the flexible display panel.

In an embodiment, the substrate 110 covers the display area AA and the non-display area NA surrounding the display area AA, and at least one film layer in the array layer 200 extends to the non-display area NA. For example, in an embodiment, the buffering layer 120, the gate insulation layer 212, the interlayer insulation layer 214, and the passivation layer 220 respectively include a portion extending to the non-display area NA.

In an embodiment, the flexible display panel further includes a bank 500 disposed in the non-display area NA. The bank 500 may be disposed on the passivation layer 220, for example, between the passivation layer 220 and the encapsulation layer 400. An orthographic projection of the bank 500 on the substrate 110 surrounds the planarization layer 230. That is, an edge of an orthographic projection of the planarization layer 230 on the substrate 110 is located on a side of the bank 500 close to the display area AA.

In an embodiment, the bank 500 includes a first dam 510 and a second dam 520. The first dam 510 surrounds the display area AA, and the second dam 520 is separated from the first dam 510 and surrounds the first dam 510. The encapsulation layer 400) covers the first dam 510 and is located in an area surrounded by the second dam 520. The first organic encapsulation layer 420 is located in an area surrounded by the first dam 510, and the first dam 510 prevents the organic material in the encapsulation layer 400 from overflowing.

In an embodiment, the first dam 510 and the second dam 520 are both of a multi-layer structure, and include a first bank layer 501 and a second bank layer 502, respectively. The first bank layer 501 and the second bank layer 502 are sequentially stacked in a direction away from the substrate 110. In an embodiment, the first bank layer 501 is made in a same layer and with a same material as the planarization layer 230, and the second bank layer 502 is made in a same layer and with a same material as the pixel definition layer 340, thereby simplifying the manufacture, avoiding the introduction of additional layers, and improving material utilization.

In an embodiment, the flexible display panel further includes a photo spacer (PS) (not shown). The photo spacer is located between the pixel definition layer and the cathode layer. The photo spacer may be of an organic material, and may be composed of melamine resin, polystyrene resin, or the like. Therefore, the PS has a certain elasticity, and thus the PS can have both an improved buffering effect and a supporting effect on the film layer.

In an embodiment, the bank 500 further includes a third bank layer 503 located on the second bank layer 502. The third bank layer 503 is formed in a same layer and with a same material as the photo spacer.

In other embodiments, the bank can also be a separately manufactured material including carbon, nitrogen, oxygen, etc. and having a certain hardness, for example, heterocyclic polymer containing imino group and benzene ring, polyetherimide, and the like.

The bank of the present disclosure is not limited to include only two dams, and the bank can include any number of dams as needed. It should also be noted that the dam in the present disclosure is not limited to a three-layer laminated structure formed by a patterned planarization layer, a patterned pixel definition layer and a patterned PS, and the number of layers constituting the dam can be changed as needed. For example, the dam can be formed merely by a patterned PS. The first dam and the second dam may have a same structure and composition, or have different structures and compositions.

In an embodiment, the flexible display panel further includes an inorganic layer 800 on a side of the substrate. The inorganic layer 800 may be located in the array layer 200. For example, the inorganic layer 800 is located in the non-display area NA. In this case, the inorganic layer 800 can be selected from the buffering layer 120, the gate insulation layer 212, the interlayer insulation layer 214, the passivation layer 220, or combinations thereof in the non-display area NA.

An embodiment in which the inorganic layer is a combination of the gate insulation layer 212, the interlayer insulation layer 214, and the passivation layer 220 located in the non-display area NA is illustrated below.

In one embodiment, as shown in FIG. 3, the inorganic layer 800 includes a recessed region 810 and non-recessed regions 820. The recessed region 810 includes a recess 811 having an opening 830 facing away from the substrate. In an embodiment, the recess 811 penetrates through the inorganic layer 800 (i.e., the gate insulation layer 212, the interlayer insulation layer 214, and the passivation layer 220). Alternatively, the recessed structure provided in this embodiment may be understood as follows: the inorganic layer 800 consists of the buffering layer 120, the gate insulation layer 212, the interlayer insulation layer 214 and the passivation layer 220; and the recess 811 does not penetrate through the inorganic layer 800.

In at least one first cross-section (e.g., the cross-section of the flexible display panel shown in FIG. 3), the non-recessed regions 820 of the inorganic layer 800 are located on both sides of the recessed region 810. For the purpose of thinning the flexible display panel, the organic layer at the side of the recessed region away from the display area can be removed. That is, in other embodiments of the present disclosure, it is also appliable that the non-recessed region is located on at least one side of the recessed region.

It can be understood that, unless otherwise specified, regions of a film layer or film layer combination are divided from the plane of the film layer (or the film layer combination) such that these regions are non-overlapped in a direction perpendicular to the plane of the display panel, rather than divided from the film layer along a direction perpendicular to the film layer (or the film layer combination). Therefore, when the present disclosure describes that a certain region is located on a side of another region in a same layer, it refers to a side in a direction parallel to the plane of this film layer.

The flexible display panel further includes an organic layer 900 located on the side of the inorganic layer 800 away from the substrate 110. In an embodiment, the organic layer 900 can be formed in a same layer and with a same material as one or more of the passivation layer 220 and the pixel definition layer 340. The organic layer 900 can also be formed in a same layer and with a same material as the organic material in the encapsulation layer 400. The organic layer 900 includes a filling portion 910. A projection of the filling portion 910 in a direction perpendicular to the substrate 110 (i.e., an orthographic projection on the substrate 110) is located in the recess 811 of the recessed region 810. A surface (or an upper surface) of the filling portion 910 of the organic layer 900 away from the substrate 110 is a concave surface 911. The concave surface 911 is recessed toward the substrate.

An edge of the filling portion 910 may be level with an edge of the opening of the recess 811. It can be understood that, when the recess 811 penetrates through the inorganic layer 800, the opening of the recess 811 includes a bottom surface opening on the bottom surface of the inorganic layer 800, and a top surface opening on the top surface of the inorganic layer 800. Side walls of the recess 811 are connected between the bottom surface opening and the top surface opening. The fact that the edge of the filling portion 910 is level with the edge of the opening of the recess 811 actually means that a height of the edge of the upper surface of the filling portion 910 is level with a height of the top surface opening of the recess 811 in a direction perpendicular to the display panel.

In an embodiment, the edge of the upper surface of the filling portion 910 is further engaged with the top surface opening of the recess 811. That is, no space exists between the filling portion 910 and the side walls of the recess 811.

Referring to FIGS. 2 and 3, in the first cross-section, the projection of the recessed region 810 in the direction perpendicular to the substrate 110 covers the bending region BB. It can be understood that, in an embodiment of the present disclosure, the step region formed by the inorganic layer 800 does not belong to the recessed region 810. In other words, the organic layer 900 covering the side walls of the recess 811 does not belong to the filling portion.

In an embodiment, the recessed region 810 includes a portion located in the bending region BB, and a portion extending from the bending region BB to the non-bending region UB. That is, a part of the recessed region 810 is located in the non-bending region UB, so that the non-recessed regions 820 disposed on both sides of the recessed region 810 are completely located in the non-bending region UB.

It should be noted that, when bending the display panel, the bending position often may not allow the display panel to be bent accurately along a desired position. In particular, in order to achieve a narrow border, after the manufacturing of display panel is completed, bending errors occur when folding the border to the back of the display panel such that a bent area is larger than a desired bent area, or a bending position deviates away from a predetermined bending position. With the flexible display panel according to the embodiment of the present disclosure, it is possible to avoid a bending in the non-recessed area caused by the bending errors, thereby providing a certain tolerance; and a covering area of the filling portion is increased, i.e., an area covered by the concave surface is increased, thereby enhancing the ability of the concave surface of alleviating bending.

In an embodiment, the recessed region 810 (or recess 811) is a stripe-shaped recessed region 810 (or recess 811) extending along the extension direction of the bending axis K of the bending region BB.

The stress concentration may occur at a step at the boundary between the inorganic recess and the non-recessed region such that the bending region and non-bending region are subject to inhomogenous stress when the flexible display panel is being bent. This would cause peeling or breakage of the film layer of the flexible display panel, and reduces the stability of the flexible display panel. By the design of the embodiments of the present disclosure, the non-recessed region is completely located in the non-bending region, and the bending reliability of the flexible display panel is further improved.

In an embodiment, the flexible display panel further includes a wiring 700 located on a side of the organic layer 900 away from the inorganic layer 800. In the first cross-section, an orthographic projection of the wiring 700 on the substrate 110 overlaps the orthographic projection of the filling portion 910 on the substrate 110.

It can be understood that the wiring herein can be a signal line extending from the display area, or can be a leadwire in fan-out area for connecting pads and the signal lines in the display area. The material of the wiring is not specifically limited herein. It can be a single layer of metal, multiple layers of metal, metal alloy, indium tin oxide, a transparent conductive material, or the like.

In other embodiments of the present disclosure, the wiring can be formed as a single layer of conductive material on the organic layer. The wiring extends over the recessed region. Two ends of the wiring are located in the non-recessed regions on both sides of the recessed region, respectively. The two ends of the wiring are connected to the conductive interlayer in the middle of the organic layer via through-holes. The conductive interlayer herein can be a signal line in the array layer extending from the display area. For example, the conductive interlayer can be a metal line between the gate insulation layer, the interlayer insulation layer, and the passivation layer, and can also be a leadwire in the fan-out area for connecting the pads and the signal lines in the display area.

In an embodiment, the flexible display panel further includes a touch function layer 600 located on a side of the encapsulation layer 400 away from the array layer 200. The touch function layer 600 includes a touch electrode 610 and a touch wiring 620.

In an embodiment, the touch function layer 600 includes multiple layers. For example, the touch electrode 610 includes a plurality of first touch electrodes 611 and a plurality of second touch electrodes 612. The first touch electrodes 611 and the second touch electrodes 612 overlap in a direction perpendicular to the display panel. The first touch electrodes 611 can be spaced from the second touch electrodes 612 by a touch insulation layer 630. In other embodiments of the present disclosure, a bridge structure can also be arranged at the overlapping position of the electrodes to ensure that the first touch electrodes are insulated from the second touch electrodes. In the present embodiment, the touch electrodes are strip-shaped rectangular electrodes. The touch electrodes can also adopt other shapes, such as triangle, diamond, hexagon and the like, or each touch electrode can be a strip-shaped electrode formed by connecting a plurality of sub-electrodes.

The touch wiring 620 is arranged in the non-display area outside the display area. An external touch circuit (for example, a control chip, not shown) is connected to the touch electrodes 610 by the touch wiring 620.

In an embodiment, the wiring 700 and the touch wiring 620 are of a same material and in a same layer. In this way, not only additional manufacturing processes are avoided, but also an increase in the thickness of the flexible display panel due to the additional layers can be avoided, thereby facilitating the bending of the display panel.

In the flexible display panel provided in the embodiments of the present disclosure, the inorganic layer is etched to form the inorganic recess, so that the flexible display panel can be successfully bent. The wiring is arranged on the organic layer. The organic layer can not only exert a buffering effect to same extent and alleviate the bending stress on the wiring, but also avoid metal residues left on the bottom, sidewalls and steps of the recess during forming of the wiring by patterning. Therefore, a short circuit between the wirings that may influence the display effect of the flexible display panel is avoided In addition, by providing wiring on the filling portion, the filling layer made of an organic material can exert the buffering effect on the wiring. By providing a recess in the filling portion, the wiring provided on the concave surface of the filling portion also has a certain radian. On the one hand, the concave surface is a non-flat surface, and thus the wiring can have an improve adhesion to the organic layer so that the peeling of the film layer is avoided. On the other hand, the film layer is relatively elongated after being bent, the wiring can be bent to some extent in advance by providing the wiring on the upper surface of the filling portion. Such bending can be formed during the manufacturing without any risk. After the flexible display panel is bent, the bending direction of the wiring is converted into a direction away from the substrate from a direction facing toward the substrate. The pre-designed bending of the wiring can be utilized to compensate the stretching of the wiring after the flexible display panel is bent, thereby preventing the wiring from being broken due to the bending of the flexible display panel.

In addition, the wiring is stretched after being bent, leading to an increase in its length. The increase in length may be irreversible. When the flexible display panel is recovered to its flattened state, based on a design of the film layer, there is no sufficient space to accommodate the elongated part of the wiring, so that the wiring may form a bulge. In contrast, in the flexible display panel provided in the embodiments of the present disclosure, the wiring is bent to some extent in advance, i.e., the wiring is pre-stretched, and the concave surface designed in the filling portion can well accommodate the elongated part of the wiring, so that area occupied by the wiring does not increase (i.e., the area of an orthographic projection of the wiring on the substrate remains unchanged) and the thickness of the flexible display panel also does not increase. In this way, the phenomenon that the elongation of the wiring after the flexible display panel is bent is avoided, thereby improving the above problems.

It can be understood that, the embodiment of the present disclosure are described in combination of the first cross-section of the flexible display panel. That is, it is merely required that a surface of the filling portion away from the substrate is a concave surface in at least one first cross-section. The first cross-section of the flexible display panel is perpendicular to the substrate and parallel to the extension direction of wiring.

Figure 4:
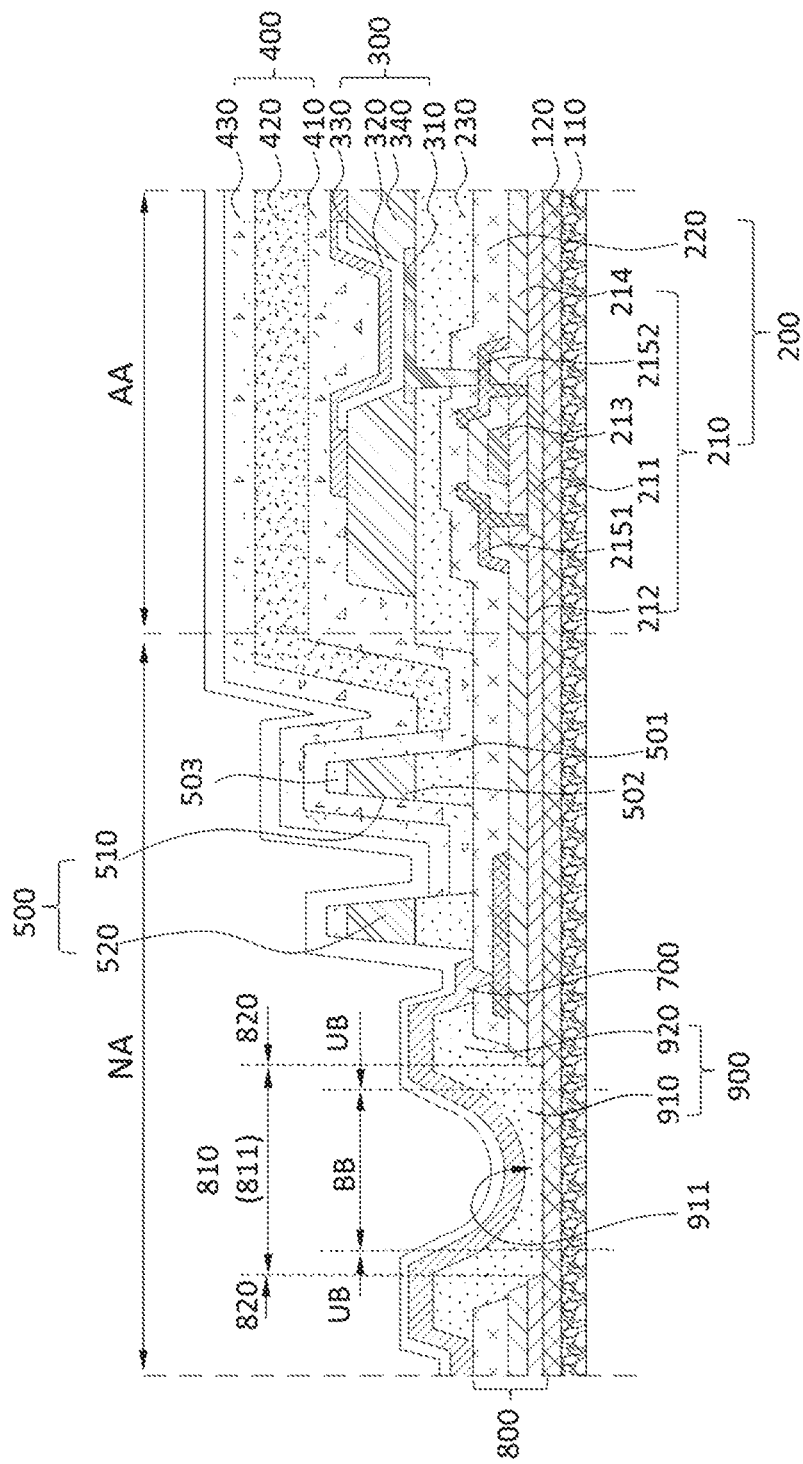
FIG. 4 is a schematic cross-sectional view of another flexible display panel according to an embodiment of the present disclosure.

FIG. 4 is a schematic cross-sectional view of another flexible display panel according to an embodiment of the present disclosure. The cross-section shown in FIG. 4 is perpendicular to the flexible display panel, and may correspond to the first cross-section in the above embodiments.

The organic layer 900 includes a filling portion 910 and climbing portions 920.

A projection of the filling portion 910 in the direction perpendicular to the substrate 110 (i.e., an orthographic projection on the substrate 110) is located in the recess 811 of the recessed region 810. A surface (or an upper surface) of the filling portion 910 of the organic layer 900 away from the substrate 110 is a concave surface 911, and the concave surface 911 is recessed towards the substrate.

A projection of the climbing portion 920 in the direction perpendicular to the substrate 110 (i.e., an orthographic projection on the substrate 110) covers the boundary between the recessed region 810 and the non-recessed region 820. In other words, the climbing portion 920 covers a step between the recessed region 810 and the non-recessed region 820. Each climbing portion 920 partially covers the non-recessed region 820 and contacts with the upper surface of the non-recessed region 820 of the inorganic layer 800. In this way, the sidewalls of the filling portion 910 and the recess 811 do not overlap, that is, the filling portion 910 does not cover the inorganic step.

In an embodiment, in at least one first cross-section, the orthographic projection of the concave surface 911 of the organic layer 900 on the substrate 110 does not overlap the orthographic projection of the non-recessed region 820 on the substrate 110, and the orthographic projection of the concave surface 911 of the organic layer 900 on the substrate 110 does not overlap the orthographic projection of the side wall of the recess 811 on the substrate 110. In other words, when the recess 811 is a recess penetrating through the inorganic layer 800, the orthographic projection of the concave surface 911 of the organic layer 900 on the substrate 110 does not overlap the orthographic projection of the inorganic layer 800 on the substrate 110.

It can be understood that the filling portion 910 and the climbing portions 920 are referred to as two different regions of the organic layer 900. In the embodiments of the present disclosure, the plane of the film layer (or the film layer combination) is divided into regions that do not overlap one another in a direction perpendicular to the display panel, rather than being divided along a direction perpendicular to the film layer. Therefore, the filling portion 910 and the climbing portions 920 do not overlap one another.

In an embodiment, the first cross-section of the flexible display panel is not parallel to the bending axis of the bending region BB. In an embodiment, in the first cross-section, the non-recessed regions 820 in the inorganic layer 800 are located on two sides of the recessed region 810, and the climbing portions 920 are located on two sides of the filling portion 910. Further, the filling portion 910 is directly connected to the climbing portions 920, and no other region or other structure is interposed therebetween. That is, in the first cross-section, only one filling portion 920 is located between the climbing portions 920 respectively located on the two sides of the recessed region 810. How to define the number of the filling portion as "one" will be explained in detail later.

In an embodiment, the climbing portion 920 is located in the non-bending region UB. Since the climbing portion is located on the inorganic step and the stress concentration is more likely to occur in the area of the step, arranging the climbing portion in the non-bending region is more conducive to the adhesion between the climbing portion and the inorganic layer, thereby preventing the peeling of the film layer and avoiding the stress concentration in the organic layer.

In the flexible display panel provided in the embodiment of the present disclosure, in addition to the filling portion having the concave surface in the organic layer, the organic layer further includes an organic layer portion that is not provided with a concave surface and covers the climbing portion of the inorganic step. The climbing portion allows the filling portion to be better connected to the inorganic layer. No recess is designed on the climbing portion, so that the climbing portion is more suitable to be arranged in the non-bending region of the flexible display panel. The climbing portion located in the non-bending region has a stronger adhesion to the inorganic layer, and the filling portion is connected to the climbing portion, thereby avoiding the peeling of the film layer. At the same time, when a wiring is arranged on the organic layer, the climbing portion can play a certain transitional role. When the wiring extends from the non-recessed region to the recessed region, the material under the wiring transits from the inorganic layer to the combination of the inorganic layer and the organic climbing portion, and finally becomes the organic filling portion. In this way, a breakage caused by a sudden change in the hardness of the material of the material under the wiring can be avoided.

Figure 5:
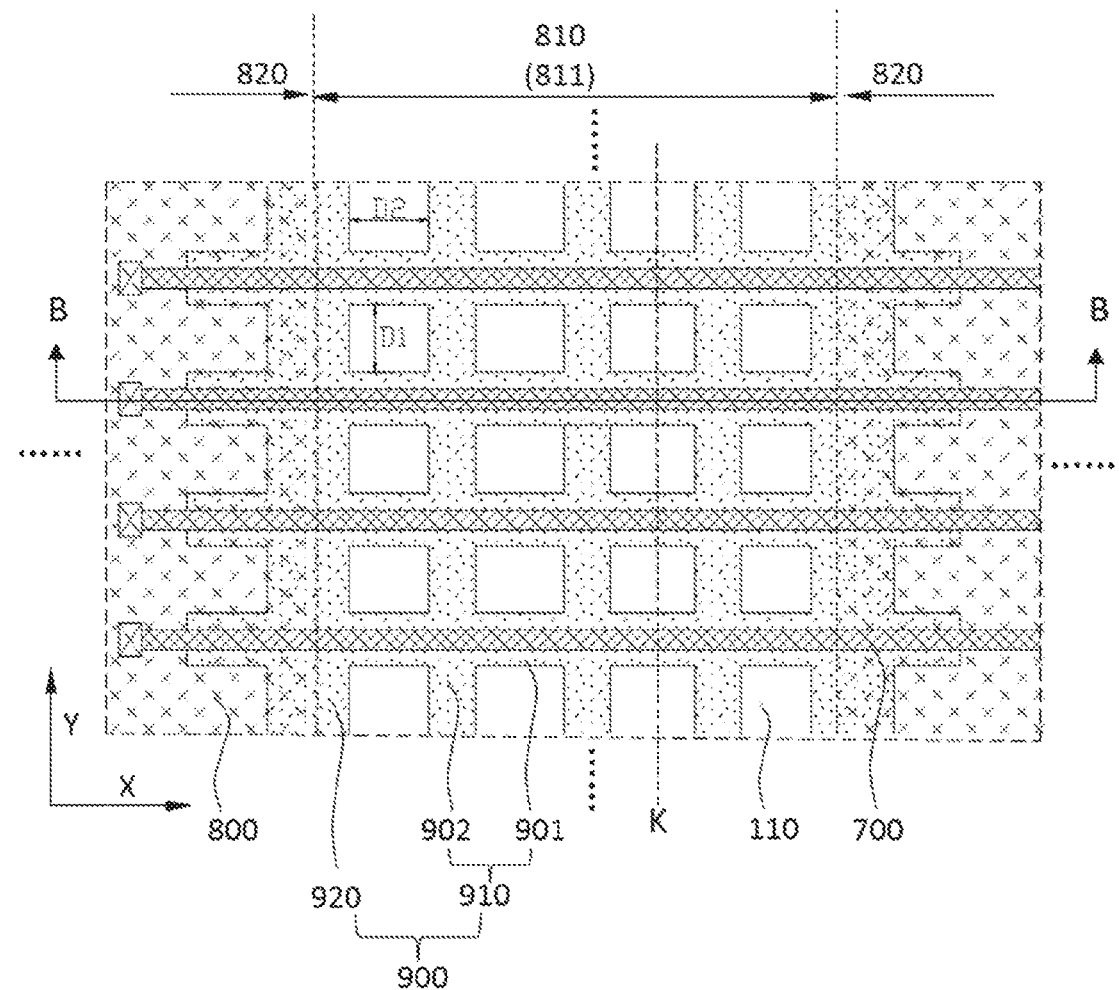
FIG. 5 is a partially enlarged top view of another flexible display panel according to an embodiment of the present disclosure.
Figure 6:
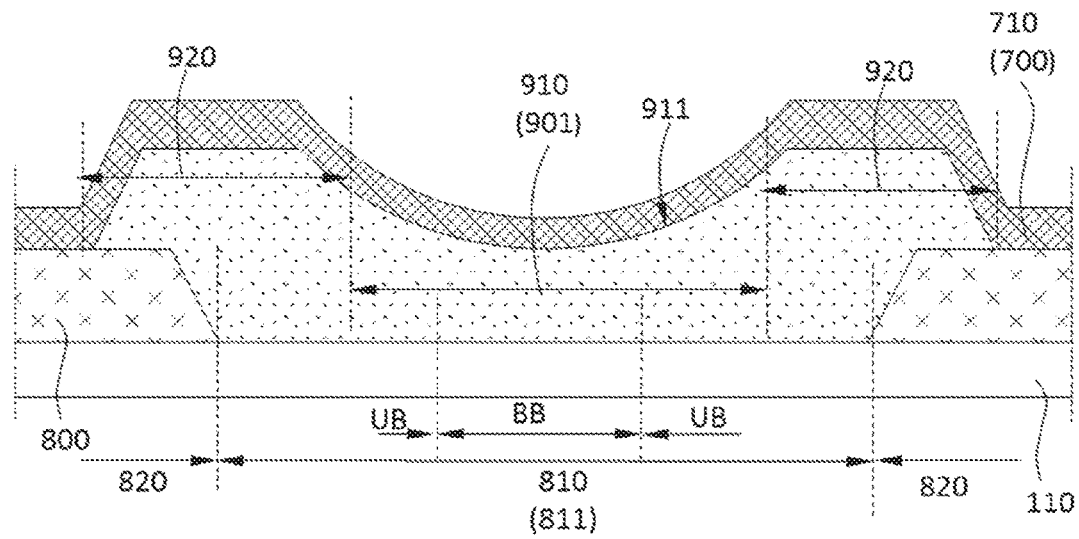
FIG. 6 is a cross-sectional view along B-B direction in FIG. 5.
Figure 7:
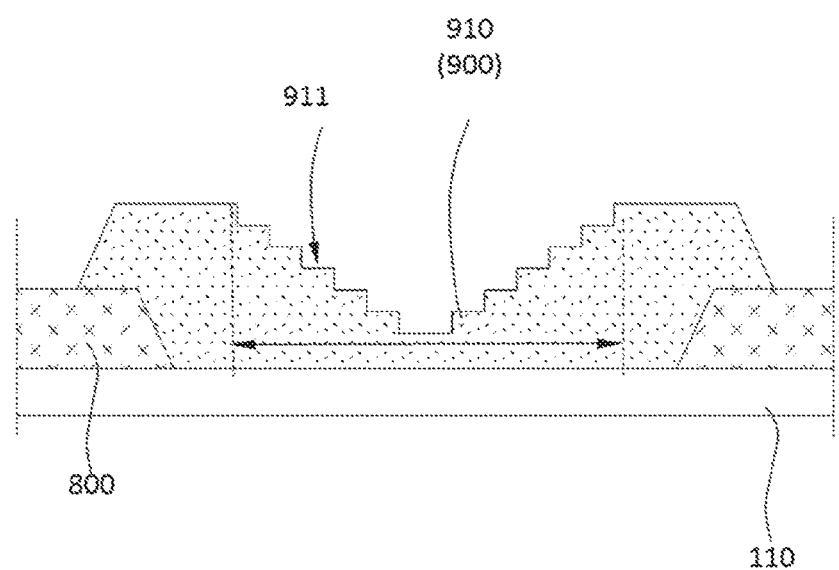
FIGS. 7-15 are partially enlarged cross-sectional views of different recessed regions according to embodiments of the present disclosure.
Figure 8:
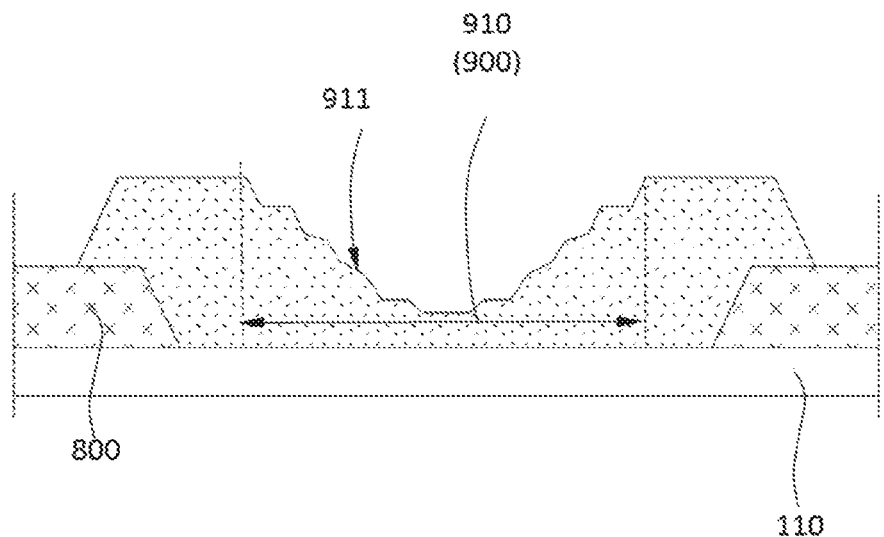
Figure 9:
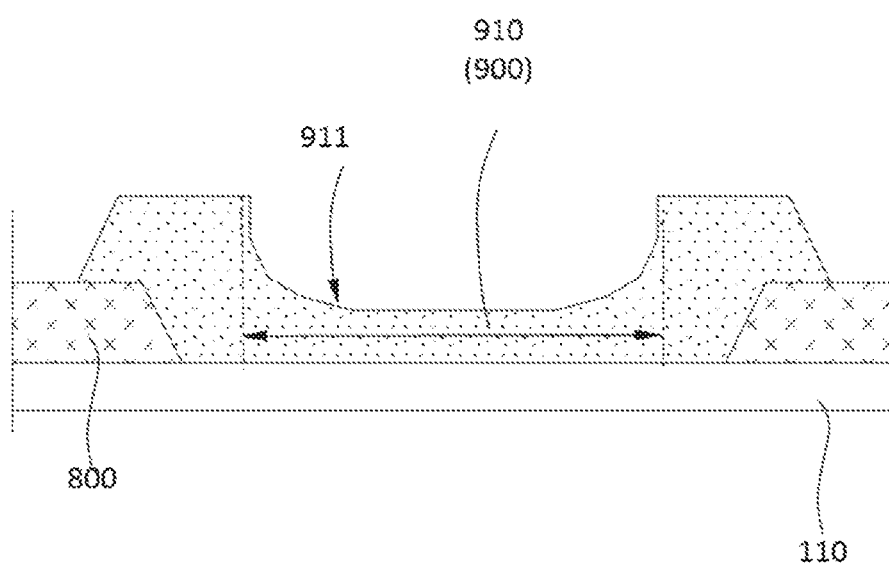
Figure 10:
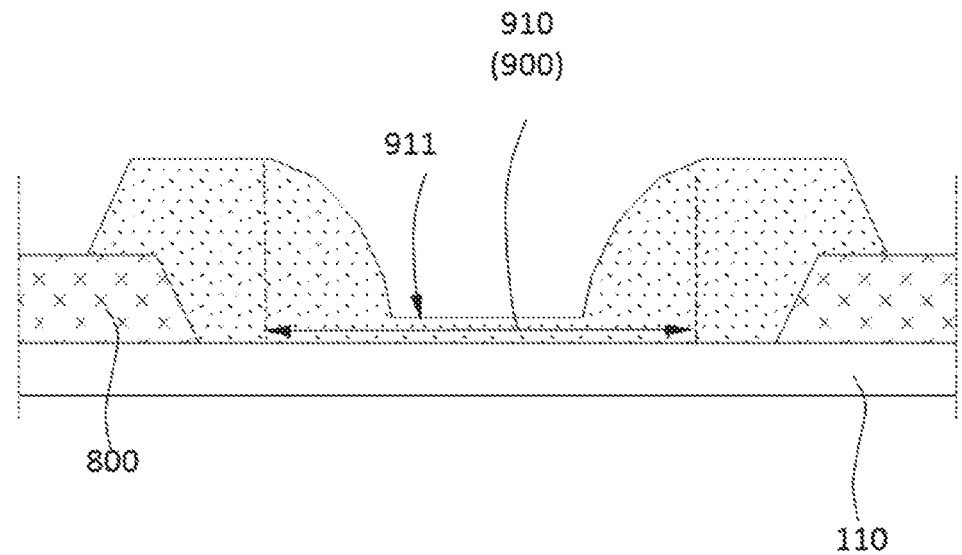

FIG. 5 is a partially enlarged top view of another flexible display panel according to an embodiment of the present disclosure, and FIG. 6 is a cross-sectional view along B-B direction in FIG. 5. It can be understood that FIG. 5 and FIG. 6 only illustrate a part of the recessed region and the non-recessed region around the recessed region. The structure not shown can be implemented by referring to the above embodiments or according to other needs. In addition, in order to facilitate the understanding of the relationship between the film layers, some film layers in FIG. 5 are illustrated in a translucent state. The cross-section along the B-B direction can be the first cross-section.

The filling portion 910 includes a plurality of first filling portions 901 and a plurality of second filling portions 902. Orthographic projections of the first filling portions 901 on the substrate 110 intersect orthographic projections of the second filling portion 902 on the substrate 110. The plurality of first filling portions 901 extends along a first direction X and is arranged along a second direction Y, and every two adjacent first filling portions 901 have a first interval D1 therebetween. The plurality of second filling portions 902 extends along the second direction Y and is arranged along the first direction X, and every two adjacent second filling portions 902 have a second interval D2 therebetween. The first direction X intersects the second direction Y. The stripe-shaped first filling portions 901 and stripe-shaped second filling portions 902 of the filling portion 910 form a mesh structure. In this way, the intervals between the stripe-shaped filling portions can block cracks of the organic layer caused by bending, thereby avoiding spreading of the cracks.

In an embodiment, the second direction Y is parallel to the extension direction of the bending axis K of the bending zone BB. That is, the second filling portions 902 are strip-shaped patterns extending along the extension direction of the bending axis K.

In this way, the second filling portions extending in the direction of the bending axis assist in limiting the bending direction. In other words, the second intervals between the plurality of second filling portions provide bending paths for bending. At the same time, the second filling portions also exert a support function with an anti-bending effect in a direction intersecting the extension direction thereof, thereby preventing a bending in an undesired direction.

In an embodiment, the first direction X and the second direction Y intersect and are perpendicular to one another.

In an embodiment, adjacent second filling portions 902 are connected to one another by the first filling portions 901. The plurality of first filling portions 901 extends to the climbing portion 920. The plurality of first filling portions 901 is connected to one another by the climbing portion 920. That is, the climbing portion 920 is a strip-shaped pattern extending along the edge of the recessed region 810, and the climbing portion 920 intersects the first filling portions 901. In other words, the climbing portion 920 is parallel to the second filling portions 902. The second filling portions 902 are indirectly connected to the climbing portions 920 by the first filling portions 901. Therefore, the entire organic layer 900 can be stably fixed with the non-recessed region 820.

In an embodiment, in at least one first cross-section, a side surface of the first filling portion 901 facing away from the substrate 110 is a concave surface 911. In an embodiment, the flexible display panel further includes a plurality of wirings 700 located on a side of the organic layer 900 away from the inorganic layer 800. Orthographic projections of at least a part of the wirings 700 on the substrate 110 overlap the first filling portions 901. In one embodiment, the plurality of wirings 700 includes a plurality of first wirings 710 extending over the recessed region 810. In the recessed region 810, the first wirings 710 extend along the first direction X, and orthographic projections of the first wirings 710 on the substrate 110 overlap the first filling portions 901.

In an embodiment, a width of the second filling portion 902 is smaller than or equal to a width of the second interval D2. In an embodiment, the width of the second filling portion 902 is smaller than the width of the second interval D2. In this way, it can be ensured that the flexible display panel has enough paths (i.e., the second interval) for easy bending. In addition, the second filling portion can guide the direction of bending while occupying the space of the recessed region as little as possible, thereby preventing bending errors of the flexible display panel.

In an embodiment, an orthographic projection of a portion of the climbing portion 920 covering the inorganic layer 800 on the substrate 110 includes a serrated edge. That is, a portion of the climbing portion 920 away from the filling portion 910 covers the upper surface of the non-recessed region 820 of the inorganic layer 800, and the edge of the portion of the climbing portion 920 away from the filling portion 910 is a serrated edge. The bending may curl up the edge of the film layer, causing peeling of the edge of the film layer from an adjacent film layer. Once the edge of the film layer is peeled from the adjacent film layer, the detachment will goes further and spread to the middle of the film layer. By the aid of the climbing portion and the serrated edge of the climbing portion, the climbing portion stabilizes the organic layer on the inorganic layer, and even if the edge of the organic layer (i.e., at a side of the climbing portion 920 away from the filling portion) is peeled from the inorganic layer due to bending, the peeling will be limited to one or more tooth of the serrated edge, and is unlikely to spread to other tooth, thereby lowering the risk of the peeling of the film layer and enhancing the reliability of the display panel when being bent.

In other embodiments of the present disclosure, the first direction and the second direction may intersect but are not perpendicular to one another. That is, the included angle between the extension direction of the first filling portion and the extension direction of the second filling portion is not a right angle. The extension direction of the second filling portion is the same as the extension direction of the bending axis. The film layer generates a maximum bending stress in a direction perpendicular to the bending axis. In the above design, the extension direction of the first filling portion is not perpendicular to the extension direction of the bending axis, and thus the stress concentration on the filling portion and the wirings arranged thereon is avoided, thereby lowering the risk of the breakage of the film layers and the wirings.

Through the flexible display panel provided in the embodiments of the present disclosure, not only the first filling portions can pre-bend the wirings, but also the second filling portions can define the bending direction to prevent bending errors. Moreover, the cooperation of the first filling portions and the second filling portions provides a bending path for the bending, at the same time, each wiring is pre-bent in the bending direction, and the bending of wirings in a direction without the pre-bending is restricted.

FIGS. 7 to 15 are partially enlarged cross-sectional views of different recessed regions according to embodiments of the present disclosure. It can be understood that FIGS. 7 to 15 merely illustrate a local recessed region and the non-recessed region around the recessed region. The structures not shown can be implemented with reference to the above embodiments or according to other needs. The cross-sections shown in FIGS. 7 to 15 can be understood as the first cross-sections. Other first cross-sections can refer to the above embodiments, and details are not described herein again.

As shown in FIGS. 7 to 10, the concave surface 911 of the filling portion 910 is a stepped structure consisting of a plurality of surfaces. The plurality of surfaces described herein can be a plurality of non-parallel planes. In the cross-sectional view of the filling portion 910, the concave surface 911 is presented as a polygonal line form by a plurality of straight line segments sequentially connected end to end.

In this way, through the plurality of non-parallel planes, the concave surface 911 of the filling portion 910 can be a non-flat surface, and thus the concave surface 911 of the filling portion 910 will not be too smooth. Therefore, the adhesion between the wiring and the filling portion 910 will be much stronger, avoiding attachment difficulties of the wiring on the filling portions 910 when bending occurs, and preventing the peeling of the film layer caused by the bending.

Figure 11:
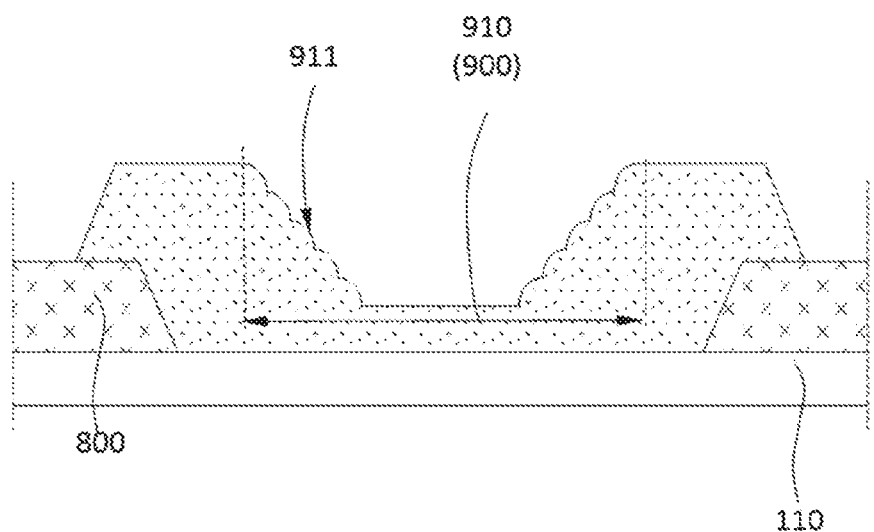
Figure 12:
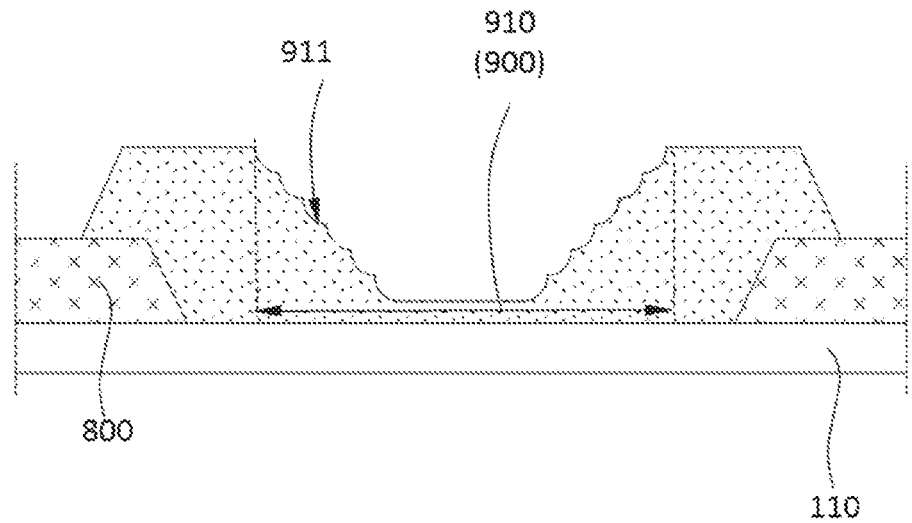
Figure 13:
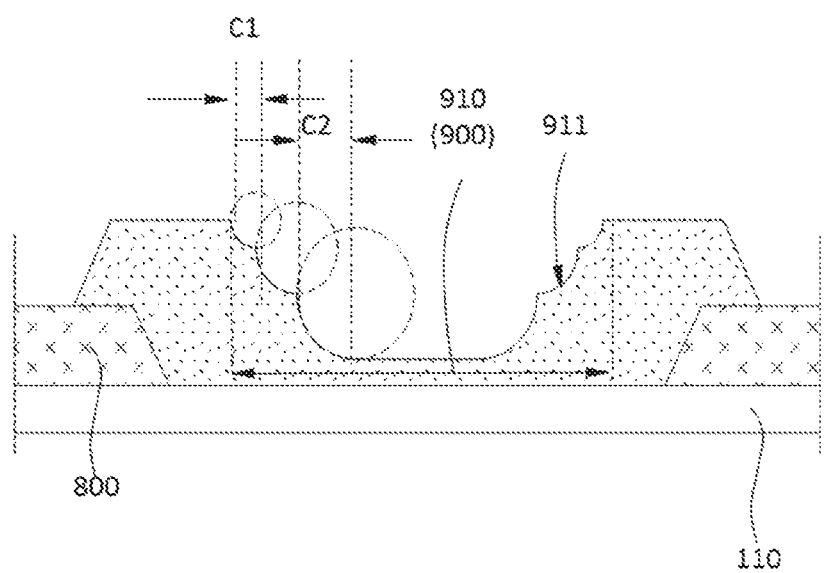

As shown in FIGS. 11 to 13, the concave surface 911 of the filling portion 910 is a wavy or petaloid structure consisting of a plurality of surfaces. The plurality of surfaces described herein can include a plurality of intersecting cambered sub-surfaces 912 intersecting end to end. In the cross-sectional view of the filling portion 910, the concave surface 911 is presented as a wavy line consisting of a plurality of arc line segments connected end to end.

Through the plurality of intersecting cambered sub-surfaces, the upper surface of the filling portion 910 can be a non-flat surface, and thus the concave surface 911 of the filling portion 910 will not be too smooth. Therefore, adhesion between the wiring and the filling portion 910 can be much stronger, avoiding attachment difficulties of the wiring on the filling portion 910 when bending occurs, and preventing the peeling of the film layer caused by the bending. In the meantime, since the concave surface 911 includes the plurality of cambered sub-surfaces, the stress concentration of the filling portion on the step can be alleviated, and the stress concentration of the wiring on the filling portion 910 at the step can be alleviated. Since a cambered surface has a larger area than a plane based on a same distance, the plurality of cambered sub-surfaces can further increase the overall area of the concave surface 911, and thus enhance the ability of the concave surface to compensate the elongated length of the organic layer 900 after being bent. In this way, the ability to pre-bend the wiring on the filling portion 910 is improved, and the bending reliability of the flexible display panel is further improved.

In an embodiment, the plurality of cambered sub-surfaces convex away from the substrate. In this way, even when the bending axis is located on a portion of the bending region close to the encapsulation layer, and the convex direction of the entire organic layer (i.e., the convex side of the organic layer after being bent) is a direction along which the organic layer faces away from the substrate, since the convex direction of the cambered sub-surfaces (i.e., a direction along which the organic layer faces towards the substrate) can be just opposite to the convex direction of the organic layer after being bent, so that the convex direction of the cambered sub-surfaces can partially offset the convex direction of the entire organic layer, thereby avoiding excessive bending of the organic layer being in all directions.

As shown in FIG. 11, in the first cross-section, one end point of each cambered sub-surface is a point along a twelve o'clock direction of its corresponding circle, and the cambered sub-surface is presented as an arc less than a quarter of the circle drawn from this point in a counterclockwise or clockwise direction. That is, each cambered sub-surface corresponds to a radius angle less than 90°, so as to avoid protrusions higher than both side regions on the upper surface of the filling portion.

In an embodiment, the plurality of cambered sub-surfaces is recessed away from the substrate. In this way, an included angle between the intersecting cambered sub-surfaces is not recessed towards the interior of the organic layer, so as to prevent the etching residues from being left in the included angle when patterning the wiring on the filled portion.

As shown in FIG. 12, in the first cross-section, an end point of each cambered sub-surface is a point in a six o'clock direction of its corresponding circle, and the cambered sub-surface is presented as an arc less than a quarter of the circle drawn from this point in a counterclockwise or clockwise direction. That is, each cambered sub-surface corresponds to a radius angle less than 90°, so as to avoid protrusion in a region of any one cambered sub-surface higher than other two cambered sub-surface adjacent to this cambered sub-surface on the upper surface of the filling portion.

Figure 14:
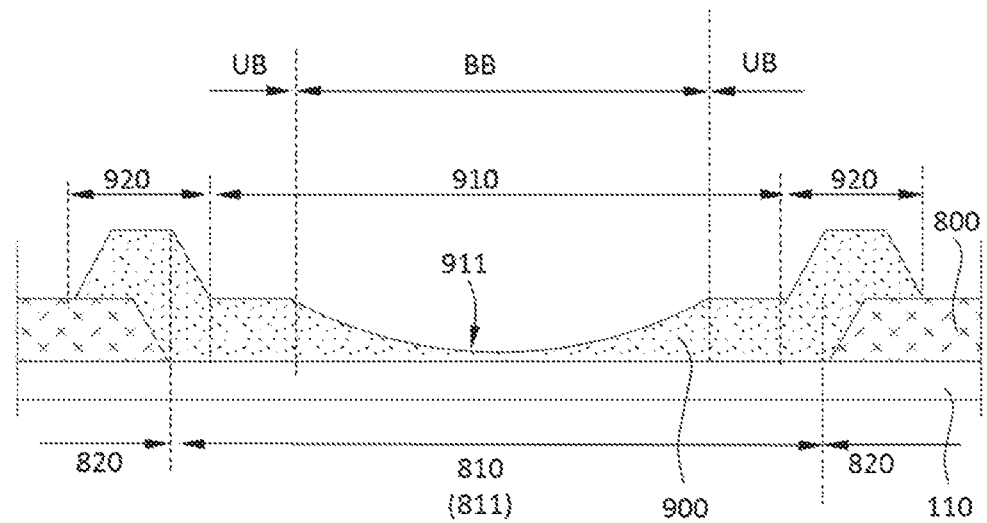

In an embodiment, as shown in FIG. 14, the region where the filling portion 910 is connected to the climbing portion 920 includes a local flat area, that is, the edge portion of the concave surface 911 is a plane. When the non-recessed region 820 and the climbing portion 920 are located in the non-bending region UB, the recessed region 810 and the filling portion 910 at least further include a portion extending from the bending region BB to the non-bending region UB, i.e., at least a portion of the recessed region 810 and the filling portion 910 is also located in the non-bending region UB. The portion of the filling portion 910 located in the non-bending region UB is not bent. Therefore, the upper surface of this portion of the filling portion 910 remains in a flat state, which is more suitable for the non-bending region.

Figure 15:
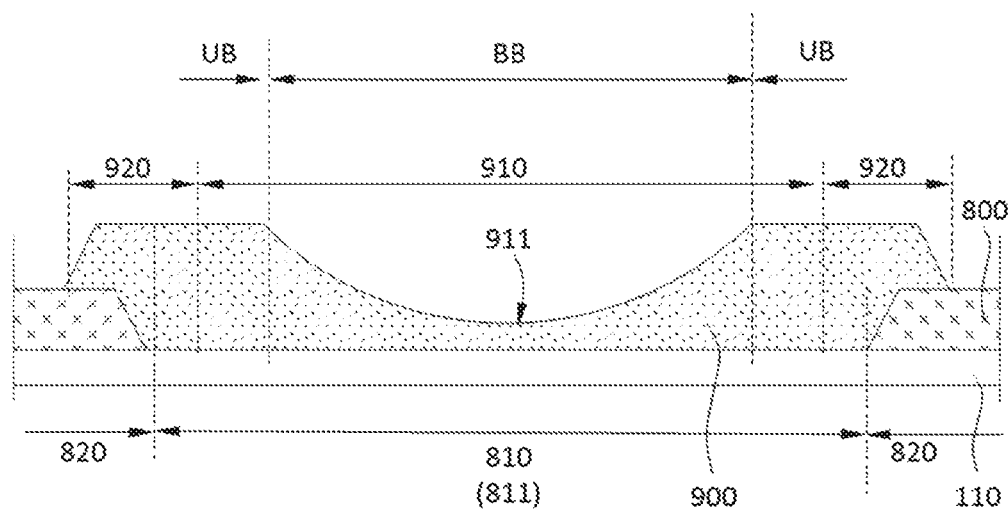

In an embodiment, as shown in FIG. 15, a height of the region where the filling portion 910 is connected to the climbing portion 920 is the same as a height of the climbing portion 920. In an embodiment, the region where the filling portion 910 is connected to the climbing portion 920 also includes a local flat area. The height described herein is a distance from the upper surface of the filling portion 910 or the climbing portion 920 to the substrate 100 in a direction perpendicular to the substrate 110.

In other embodiments of the present disclosure, in the first cross-section, the concave surface is an axisymmetric pattern, and the axis of symmetry is perpendicular to the substrate. In an embodiment, the axis of symmetry is located in the center of the bending region. In this way, the structure of the concave surface on both sides of the axis of symmetry is the same, thereby ensuring a structure of the film layer as consistent as possible while having the pre-bending effect. In this way, when the flexible display panel is being bent, the stress in the film layers tends to be uniform and stress changes in the wirings on the concave surface are consistent on two sides of the axis of symmetry of the concave surface, thereby avoiding the stress concentration. In other embodiments of the present disclosure, in the first cross-section, the concave surface can be a non-axisymmetric pattern, and patterns of the two sides of the concave surface can be differently designed according to needs.

In other embodiments of the present disclosure, the concave surface of the filling portion can be a concave surface formed by a combination of a plurality of planes and a plurality of cambered surfaces. The concave surface of the filling portion can also be presented in other patterns.

However, it can be understood that one filling portion only includes one concave surface, no matter what pattern the upper surface (or the concave surface) of the filling portion presents. The concave surface is defined such that (or referring to the previous description): one concave surface only has one lowest region, i.e., the filling portion has a smallest height in the lowest region. In the direction perpendicular to the substrate, the concave surface has a smallest height in the lowest region. The concave surface has a lowest region, along the upper surface, the height of the filling portion does not decrease in a direction from the lowest region of the concave surface towards the edge of the filling portion, or the height of the filling portion increases in this direction.

The height of the filling portion or the concave surface described herein indicates a distance from a side surface of the filling portion facing away from the substrate (i.e., the upper surface of the filling portion) to the substrate. In other words, when comparing the heights, the height mentioned herein uniformly indicates a distance from a point on the concave surface to the substrate in the direction perpendicular to the substrate, or uniformly indicates a distance from a point on the concave surface to the lower surface of the filling portion in the direction perpendicular to the substrate, or uniformly indicates the thickness of the filling portion in the direction perpendicular to the substrate at a point of the concave surface. In this way, it is avoided that protrusion in a region of any one cambered sub-surface is higher than two cambered sub-surface adjacent to this cambered sub-surface.

The reasons why the protrusions should not appear are in that: firstly, the convex directions of the protrusions and the concave surface are opposite, so that the protrusions can partially offset the pre-bending effect of the concave surface; secondly, the convex direction of the protrusion and the bending direction of the flexible display panel are the same, so that the wiring covering the protrusion on the concave surface is further bent when the flexible display panel is bent, and the bending stress becomes greater, which is disadvantageous to the stability of the film layer; thirdly, the convex directions of the protrusions and the concave surface are opposite, so that on the concave surface, a portion of the wiring covering the protrusion is in a bent state substantially different from a bent state of a portion of the wiring not covering the protrusion, leading to the stress concentration of the wiring at the position of the protrusion, and causing the breakage of the wiring.

Figure 16:
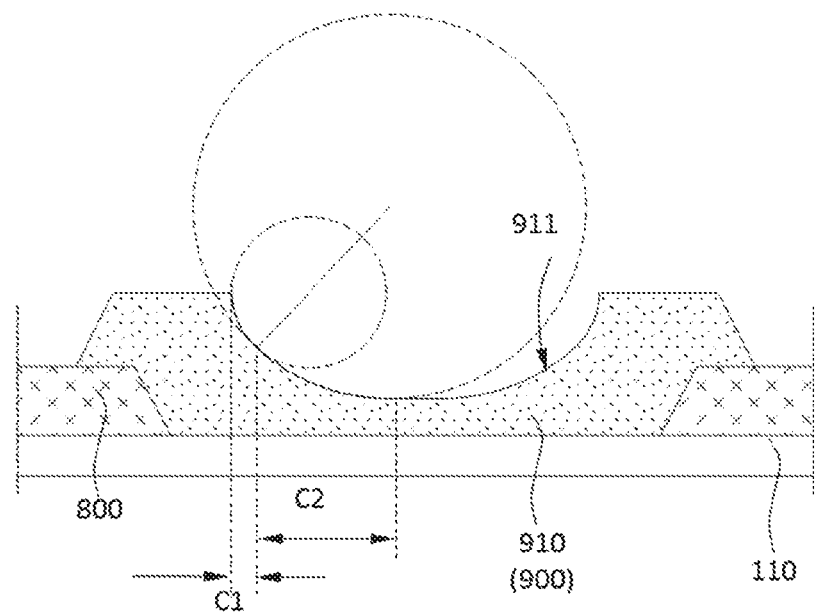
FIG. 16 is a partially enlarged cross-sectional view of another flexible display panel according to an embodiment of the present disclosure.

FIG. 16 is a partially enlarged cross-sectional view of another flexible display panel according to an embodiment of the present disclosure. It can be understood that FIG. 16 merely partially illustrates the recessed region and the non-recessed region around the recessed region. The structures not shown can be implemented with reference to the above embodiments or according to other needs. The cross-section shown in FIG. 16 can be understood as the first cross-section. Other first cross-sections can refer to the above embodiments, and details are not described herein again.

The concave surface 911 of the filling portion 910 is a cambered surface. That is, the entire concave surface 911 is formed by the cambered surface, so as to avoid steps in the filling portion 910, thereby avoiding the stress concentration of the wiring on the steps of the filling portion 910. In the meantime, the presence of the etching residues is avoided during patterning of the wiring on the filling portion 910.

In an embodiment, the concave surface 911 includes first regions C and second regions C2. Each first region C1 is located on a side of the second region C2 close to the non-recessed region. The curvature radius of the first region C1 is smaller than the curvature radius of the second region C2. That is to say, although the cambered surface is a smooth integral cambered surface, the first region C1 and the second region C2 of the cambered surface respectively belong to two tangent circles with different radii, and the radius of the circle corresponding to the first region C1 is smaller than the radius of the circle corresponding to the second region C2.

In an embodiment, the second region C2 is located at a side of the first region C1 close to the center of the bending region BB.

In an embodiment shown in FIG. 13, the concave surface 911 includes first regions C1 and second regions C2. As shown in FIG. 13, the first region C1 is located on a side of the second region C2 close to the non-recessed region. The curvature radius of the first region C1 is smaller than the curvature radius of the second region C2. Compared to the embodiment shown in FIG. 16, the first region C1 and the second region C2 of the concave surface 911 in the embodiment shown in FIG. 13 are two intersecting cambered sub-surfaces, and the two cambered sub-surfaces belong to two intersecting circles having different radii, respectively.

In other embodiments of the present disclosure, the first region is not directly connected to the second region. In an embodiment, the concave surface further includes third regions. The first region can be connected to the second region by the third region. The curvature radius of the third region is greater than the curvature radius of the first region but smaller than the curvature radius of the second region, i.e., the third region is a transitional region. It can be understood that, in other embodiments of the present disclosure, the concave surface can further include fourth, fifth, or any number of regions, as long as the curvature radii of these regions gradually decrease along a direction from the recessed region to the non-recessed region.

In the flexible display panel provided in the above embodiments of the present disclosure, on the one hand, a relatively smaller curvature radius of the first region of the concave surface can make the curvature radius of the edge region of the concave surface relatively smaller, and the curvature of unit area of the edge region of the concave surface greater, which may be advantageous to the attachment of the wiring on the concave surface as well as the climbing of the wiring.

On the other hand, since the center region of the concave surface is close to the center of the bending region, when the flexible display panel is changed from the non-bent state to the bent state, the amount of change in the center region of the concave surface is the largest, and the most-recessed point of the concave surface becomes a most-convexed point of a convex surface, leading to problems of cracks, the peeling of the film layer and the like caused by the great amount of change of the film layers. Moreover, when the flexible display panel after being bent returns to the flat state, it is hard for the concave surface to be restored to the initial state. In the flexible display panel provided by the embodiments of the present disclosure, the greater curvature radius of the second region of the concave surface results in a greater curvature radius of the center region of the concave surface, so that recessed degree of unit area is not too great. In this way, even if the flexible display panel is in a bent state, the center region of the concave surface (or the most-recessed point of the concave surface) in the original state does not significantly deviate from the center region of the concave surface in the bent state of the flexible display panel. Therefore, the concave surface is pre-bent and can be easily restored from a bent state to the initial state at the same time, thereby avoiding cracks, the peeling of film layer and other problems.

Figure 17:
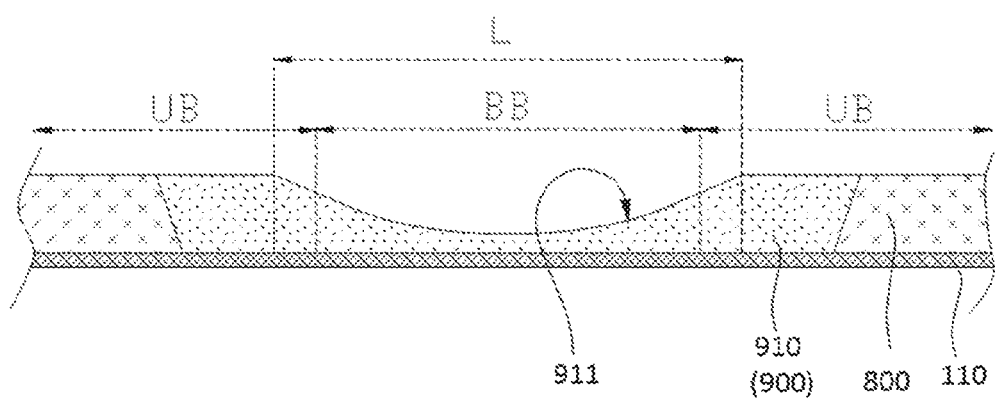
FIG. 17 is a partially enlarged cross-sectional view of another flexible display panel according to an embodiment of the present disclosure.
Figure 18:
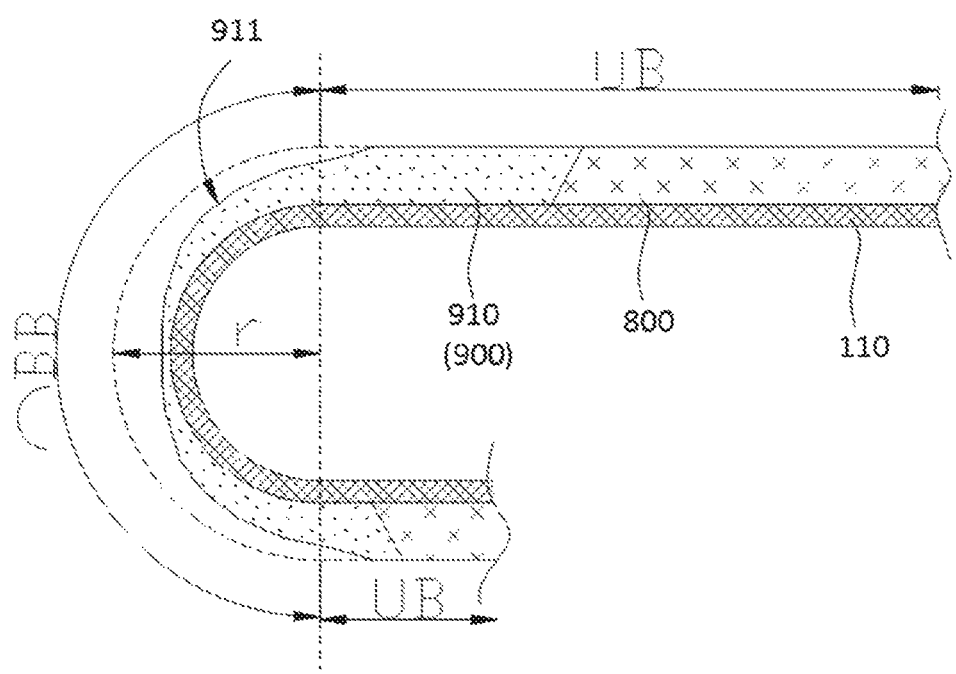
FIG. 18 is a partially enlarged cross-sectional view of another flexible display panel in a bending state according to an embodiment of the present disclosure.

FIG. 17 is a partially enlarged cross-sectional view of another flexible display panel according to an embodiment of the present disclosure, and FIG. 18 is a partially enlarged cross-sectional view of the another flexible display panel in a bent state. It can be understood that FIG. 17 and FIG. 18 merely partially illustrate the recessed region and the non-recessed region around the recessed region. The structure not shown can be implemented with reference to the above embodiments or according to other needs. The cross-sections shown in FIG. 17 or FIG. 18 can be understood as the first cross-section. Other first cross-sections can refer to the above embodiments, and details are not described herein again.

In an embodiment, the concave surface 911 of the filling portion 910 is a cambered surface, and the curvature radii of different regions of the cambered surface are identical.

In an embodiment the width of the cambered surface in the first cross-section is L, and L satisfies: $\pi \cdot r \leq L$. Here, r represents the curvature radius of the organic layer 900 after the bending region BB is bent.

When the flexible display panel is bent, the maximum bending angle of the flexible display panel is 180°, that is, the flexible display panel is bent into a state in which the non-bending regions UB on both sides of the bending region BB face each other. Especially for the non-display area, a portion of the border of the display panel can be bent to the back of the display panel by bending 180°, so that the portion of the border is parallel to the body of the display panel, and is affixed to the back of the display panel Therefore, the border can be reduced and the thickness of the display panel is not increased too much.

When the flexible display panel is bent, the curvature radius of the organic layer 900 is related to the bending capacity of the flexible display panel, the position of the organic layer, and the like. However, the arc length of the bent organic layer in the first cross-section does not exceed $\pi \cdot r$, no matter how the flexible display panel is bent. In addition, the filling portion 910 of the organic layer 900 covers the bending region BB. Therefore, the width L of the cambered surface of the filling portion 910 in the first cross-section satisfies: $\pi \cdot r \leq L$.

In this way, areas of the flexible display panel that will be bent may be all pre-bent with a cambered surface(s) before being bent. Particularly, the wiring on the cambered surface is fully pre-bent through the cambered surface. The pre-bent area includes all the area where the wiring is actually bent by the bending of the flexible display panel, thereby further improving the reliability of the bending.

Figure 19:
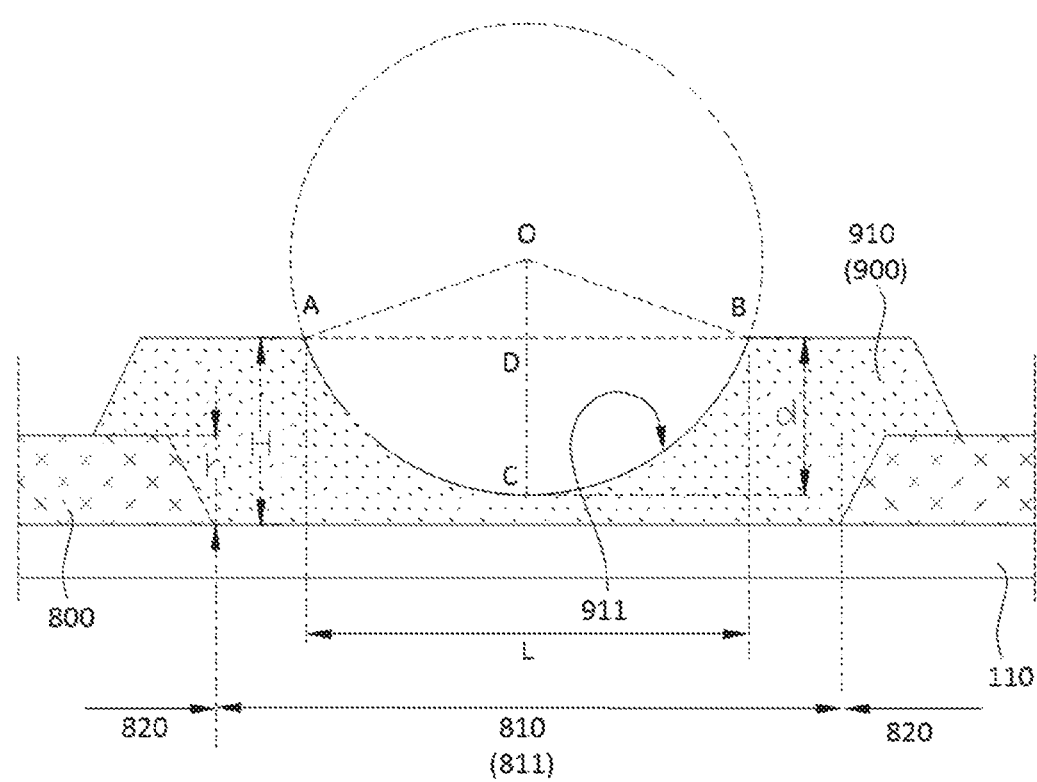
FIG. 19 is a partially enlarged cross-sectional view of another flexible display panel according to an embodiment of the present disclosure.

FIG. 19 is a partially enlarged cross-sectional view of another flexible display panel according to an embodiment of the present disclosure. It can be understood that FIG. 19 merely partially illustrates the recessed region and the non-recessed region around the recessed region. The structure not shown can be implemented with reference to the above embodiments or according to other needs. The cross-section shown in FIG. 19 can be understood as the first cross-section. Other first cross-sections can refer to the above embodiments, and details are not described herein again.

In an embodiment, the concave surface 911 of the filling portion 910 is a cambered surface. The curvature radius of the cambered surface in the first cross-section is R, and R satisfies:

$$R = \frac{\pi^2 \cdot r^2}{8d} + \frac{d}{2},$$

in which r is the curvature radius of the filling portion 910 after the bending region BB is bent, d is a height difference between a highest point and a lowest point of the cambered surface in the first cross-section in the direction perpendicular to the substrate. The lowest point is a position of the cambered surface closest to the substrate in the direction perpendicular to the substrate 110, the highest point is a position of the cambered surface farthest from the substrate in the direction perpendicular to the substrate 110, and d=CD.

From $\pi \cdot r = L$, OA=OB=OC=R, and AB=L, it can be deduced that:

$$\left(\frac{L}{2}\right)^2 + (R - CD)^2 = R^2, \text{ and } \left(\frac{\pi \cdot r}{2}\right)^2 + (R - CD)^2 = R^2.$$

$$\text{Thus, } R = \frac{\pi^2 \cdot r^2}{8CD} + \frac{CD}{2}, \text{ i.e., } R = \frac{\pi^2 \cdot r^2}{8d} + \frac{d}{2}.$$

In an embodiment, $d \leq H$, i.e., $CD \leq H$. H is the thickness of a region without a concave surface of the filling portion 910, or the thickness of the edge of the filling portion beyond the cambered surface, or the height of the filling portion 910 at the highest point in the first cross-section. Herein, the thickness is a thickness in the direction perpendicular to the substrate 110, and the height is a height in the direction perpendicular to the substrate 110. Therefore, it can be ensured that there is enough space in the direction perpendicular to the substrate to form a concave surface that is a complete cambered surface without any flat area at the bottom.

In an embodiment, $0.5h \leq H \leq 5h$. Herein, h is a depth of the recess 811 in the direction perpendicular to the substrate 110.

In this way, the height of the organic layer can be integrated with the height of the inorganic layer. By this integration, it can be ensured that the organic layer has enough space to form a concave surface, and the adhesion between the organic layer and the inorganic layer is stabilized at the same time, which is conducive to stability of the layer structure and ease of the manufacturing process.

Figure 20:
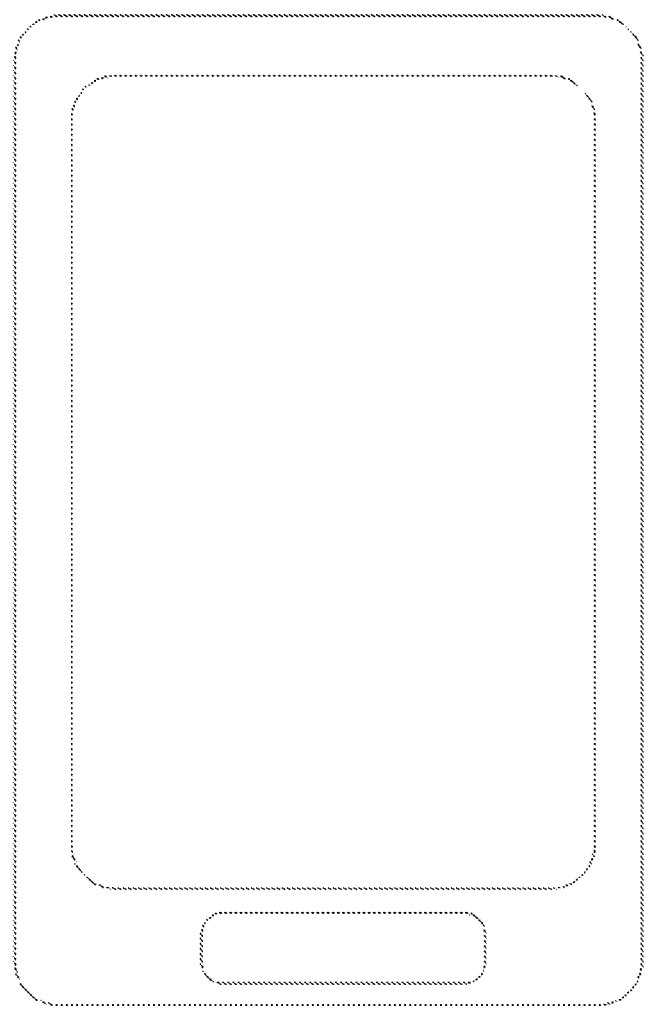
FIG. 20 is a schematic diagram of a display device according to an embodiment of the present disclosure.

The embodiments of the present disclosure further provide a display device. FIG. 20 is a schematic diagram of a display device according to an embodiment of the present disclosure. The display device includes a flexible display panel having any of the features described in the above embodiments, and a housing for protecting the flexible display panel. Other auxiliary components of the display device, such as inductive pen, camera and the like, will not be described herein.

The display device can be any of an organic light-emitting diode (OLED) display device, a quantum dot light emitting diodes (QLED) display device, a micro LED (µLED) display device, or the like, which is not particularly limited in the present disclosure. The display device can also be an OLED display device, such as mobile phone, television, tablet computer, smart watch, electronic book, vehicle display terminal, or the like.

In summary, in the flexible display panels and the display devices provided by the present disclosure, the inorganic layer is provided with the recess, the recess is filled with an organic material, and a portion of the organic material filled in the recess has a concave upper surface, so that the organic layer filled in the recess has a preset curved surface before the bending. When the flexible display panel is being bent, the preset curved surface can exert a certain buffering effect, and the bending reliability of the flexible display panel can be improved by this pre-bent surface offsetting the bent surface formed during the bending of the flexible display panel.

What is claimed is:

1. A flexible display panel, comprising
a substrate;
an inorganic layer disposed on a side of the substrate, wherein the inorganic layer comprises a recessed region and a non-recessed region, and the recessed region comprises a recess with an opening facing away from the substrate; and
an organic layer disposed on a side of the inorganic layer away from the substrate, wherein the organic layer comprises a filling portion, and a projection of the filling portion in a direction perpendicular to the substrate is located in the recess of the recessed region;
wherein a surface of the filling portion away from the substrate is a concave surface, and the concave surface is recessed toward the substrate, wherein the flexible display panel comprises a bending region and a non-bending region, wherein in at least one first cross-section, the surface of the filling portion away from the substrate is a concave surface recessed toward the substrate, and an projection of the recessed region in the direction perpendicular to the substrate covers the bending region, and
wherein the at least one first cross-section is perpendicular to the substrate, and the at least one first cross-section intersects an extension direction of a bending axis of the bending region.

2. The flexible display panel according to claim 1, further comprising a wiring disposed on a side of the organic layer away from the inorganic layer, and
an orthographic projection of the wiring on the substrate overlaps an orthographic projection of the filling portion on the substrate.

3. The flexible display panel according to claim 1, wherein the flexible display panel is divided into a display area and a non-display area surrounding the display area, and the non-display area comprises the bending region and the non-bending region.

4. The flexible display panel according to claim 1, wherein in the at least one first cross-section, the organic layer further comprises a climbing portion,
wherein the climbing portion covers a boundary between the recessed region and the non-recessed region, and
wherein the climbing portion is disposed in the non-bending region.

5. The flexible display panel according to claim 4, wherein the filling portion comprises a plurality of first filling portions and a plurality of second filling portions, and the plurality of first filling portions intersects the plurality of second filling portions,
wherein the plurality of first filling portions extends along a first direction and is arranged along a second direction, and there is a first interval between every two adjacent first filling portions of the plurality of first filling portions,
wherein the plurality of second filling portions extends along the second direction and is arranged along the first direction, and there is a second interval between every two adjacent second filling portions of the plurality of second filling portions,
wherein the first direction intersects the second direction, and the second direction is parallel to the bending axis of the bending region, and
wherein in the at least one first cross-section, a surface of each of the plurality of first filling portions away from the substrate is a concave surface.

6. The flexible display panel according to claim 5, wherein a width of each of the plurality of second filling portions is smaller than or equal to a width of the second interval.

7. The flexible display panel according to claim 5, further comprising a plurality of wirings disposed on a side of the organic layer away from the inorganic layer,
wherein orthographic projections of at least a part of the plurality of wirings on the substrate overlap the plurality of first filling portions.

8. The flexible display panel according to claim 7, wherein the plurality of wirings comprises a plurality of first wirings extending over the recessed region, and
wherein the plurality of first wirings extends along the first direction in the recessed region, and orthographic projections of the plurality of first wirings on the substrate overlap the plurality of first filling portions.

9. The flexible display panel according to claim 5, wherein every two adjacent second filling portions of the plurality of second filling portions are connected to each other by one of the plurality of first filling portions,
wherein the plurality of first filling portions extends to the climbing portion, and
wherein the plurality of first filling portions is connected to one another by the climbing portion.

10. The flexible display panel according to claim 4, wherein an edge of a portion of the climbing portion covering the inorganic layer has an orthographic projection with a serrated edge on the substrate.

11. The flexible display panel according to claim 1, wherein the concave surface is a cambered surface.

12. The flexible display panel according to claim 1,
wherein the concave surface comprises a first region and a second region, the first region is located on a side of the second region close to the non-recessed region, and a curvature radius of the first region is smaller than a curvature radius of the second regions.

13. The flexible display panel according to claim 11,
wherein the cambered surface comprises a first region and a second region, the first region is located on a side of the second region close to the non-recessed region, and a curvature radius of the first region is smaller than a curvature radius of the second regions.

14. The flexible display panel according to claim 11, wherein the cambered surface has a width L in the first cross-section, and L satisfies $\pi \cdot r \leq L$, and
wherein r represents a curvature radius of the organic layer after the bending region is bent.

15. The flexible display panel according to claim 11, wherein a curvature radius of the cambered surface in the first cross-section is R, and R satisfies $$R = \frac{\pi^2 \cdot r^2}{8d} + \frac{d}{2},$$

wherein
r represents a curvature radius of the filling portion after the bending region is bent, and
d is a height difference between a highest point and a lowest point of the cambered surface in the first cross-section, the height difference is in the direction perpendicular to the substrate, the lowest point is a point on the cambered surface closest to the substrate in the direction perpendicular to the substrate, and the highest point is a point on the cambered surface farthest from the substrate in the direction perpendicular to the substrate.

16. The flexible display panel according to claim 15, wherein $d \leq H$, and $0.5h \leq H \leq 5h$,
wherein H is a thickness of a region without a cambered surface of the filling portion in the direction perpendicular to the substrate, and
wherein h is a depth of the recess in the direction perpendicular to the substrate.

17. The flexible display panel according to claim 1, wherein
an orthographic projection of the concave surface on the substrate does not overlap an orthographic projection of a side wall of the recess.

18. The flexible display panel according to claim 1,
wherein the concave surface comprises a lowest region,
wherein along the concave surface, a height of the filling portion increases in a direction from the lowest region towards an edge of the filling portion,
wherein the filling portion has a smallest height at the lowest region, and
wherein the height is a distance from a side surface of the filling portion away from the substrate to the substrate in the direction perpendicular to the substrate.

19. A display device, comprising:
a flexible display panel, wherein flexible display panel comprises:
a substrate;
an inorganic layer disposed on a side of the substrate, wherein the inorganic layer comprises a recessed region and a non-recessed region, and the recessed region comprises a recess with an opening facing away from the substrate; and
an organic layer disposed on a side of the inorganic layer away from the substrate,
wherein the organic layer comprises a filling portion, and a projection of the filling portion in a direction perpendicular to the substrate is located in the recess of the recessed region;
wherein a surface of the filling portion away from the substrate is a concave surface, and the concave surface is recessed toward the substrate,
wherein in at least one first cross-section, the surface of the filling portion away from the substrate is a concave surface recessed toward the substrate, and an projection of the recessed region in the direction perpendicular to the substrate covers the bending region, and
wherein the at least one first cross-section is perpendicular to the substrate, and the at least one first cross-section intersects an extension direction of a bending axis of the bending region.

* * * * *